(12) United States Patent
Bae et al.

(10) Patent No.: US 11,538,887 B2
(45) Date of Patent: Dec. 27, 2022

(54) DISPLAY DEVICE AND METHOD OF MANUFACTURING THE SAME

(71) Applicant: Samsung Display Co., Ltd., Yongin-Si (KR)

(72) Inventors: Jong Man Bae, Hwaseong-si (KR); Se Hun Park, Hwaseong-si (KR); Chang Mo Park, Seoul (KR); So Yeon Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 16/705,359

(22) Filed: Dec. 6, 2019

(65) Prior Publication Data
US 2020/0235189 A1 Jul. 23, 2020

(30) Foreign Application Priority Data

Jan. 21, 2019 (KR) ........................ 10-2019-0007778

(51) Int. Cl.
*H05K 1/00* (2006.01)
*H05K 1/03* (2006.01)
*H05K 1/09* (2006.01)
*H05K 1/11* (2006.01)
*H05K 1/18* (2006.01)
*H05K 3/26* (2006.01)
(Continued)

(52) U.S. Cl.
CPC .......... *H01L 27/3276* (2013.01); *H05K 1/113* (2013.01); *H05K 1/147* (2013.01); *H05K 3/26* (2013.01); *H05K 3/361* (2013.01); *H01L 2227/323* (2013.01); *H05K 2201/056* (2013.01); *H05K 2201/10128* (2013.01); *H05K 2203/0285* (2013.01); *H05K 2203/166* (2013.01)

(58) Field of Classification Search
CPC .. H05K 1/00; H05K 1/03; H05K 1/09; H05K 1/11; H05K 1/18; H05K 1/113; H05K 1/185; H05K 3/26; H05K 3/28; H05K 3/248; H05K 3/281; H05K 3/361; H05K 3/4697
USPC ........ 361/767, 749; 174/250, 254, 256, 257, 174/260
See application file for complete search history.

(56) References Cited

U.S. PATENT DOCUMENTS 9,596,760 B2 * 3/2017 Abe ........................ H01R 12/62
10,236,469 B2 * 3/2019 Chang ................. H01L 51/5246
(Continued)

FOREIGN PATENT DOCUMENTS

| KR | 10-0480455    | 4/2005 |
| KR | 10-1548949    | 9/2015 |
| KR | 10-2017-0032901 | 3/2017 |

*Primary Examiner* — Xiaoliang Chen
(74) *Attorney, Agent, or Firm* — H.C. Park & Associates, PLC

(57) ABSTRACT

A display device includes: a display substrate including a display area and a pad area disposed around the display area; a signal wiring disposed over the display area and the pad area on the display substrate; at least one wiring pad including: a pad pattern portion disposed on the pad area of the display substrate and electrically connected to the signal wiring; and a separation pattern portion separated from the pad pattern portion by a separation space; and a printed circuit board attached to the pad area of the display substrate, the printed circuit board including a lead wiring connected to the at least one wiring pad.

15 Claims, 21 Drawing Sheets

(51) Int. Cl.
  *H05K 3/28* (2006.01)
  *H01L 27/32* (2006.01)
  *H05K 1/14* (2006.01)
  *H05K 3/36* (2006.01)

(56) References Cited

U.S. PATENT DOCUMENTS

| | | | |
|---|---|---|---|
| 2003/0010812 A1 | 1/2003 | Kurita et al. | |
| 2003/0179158 A1* | 9/2003 | Sakaki | H05K 3/361 |
| | | | 345/55 |
| 2006/0102384 A1* | 5/2006 | Watanabe | H01L 23/49816 |
| | | | 174/256 |
| 2008/0094321 A1* | 4/2008 | Park | G09G 3/3225 |
| | | | 345/76 |
| 2008/0264675 A1* | 10/2008 | Lee | B23K 1/0016 |
| | | | 174/250 |
| 2008/0264681 A1* | 10/2008 | Iwai | H01L 21/4853 |
| | | | 174/257 |
| 2011/0139493 A1* | 6/2011 | Sumida | H05K 3/361 |
| | | | 174/254 |
| 2011/0300307 A1* | 12/2011 | Nakai | B23K 26/40 |
| | | | 427/555 |
| 2012/0217049 A1* | 8/2012 | Hanai | H05K 1/185 |
| | | | 174/260 |
| 2013/0153269 A1* | 6/2013 | Takahashi | H05K 1/115 |
| | | | 174/254 |
| 2015/0098197 A1* | 4/2015 | Abe | H01R 12/62 |
| | | | 361/749 |
| 2017/0263165 A1* | 9/2017 | Guo | G02F 1/1309 |
| 2017/0282290 A1 | 10/2017 | Nakamoto et al. | |
| 2018/0014405 A1* | 1/2018 | Kim | H01L 24/06 |
| 2018/0123084 A1* | 5/2018 | Kim | G06F 3/0412 |
| 2019/0129227 A1* | 5/2019 | Hanada | H01L 27/1218 |
| 2019/0221584 A1* | 7/2019 | Kang | H01L 29/78645 |

\* cited by examiner

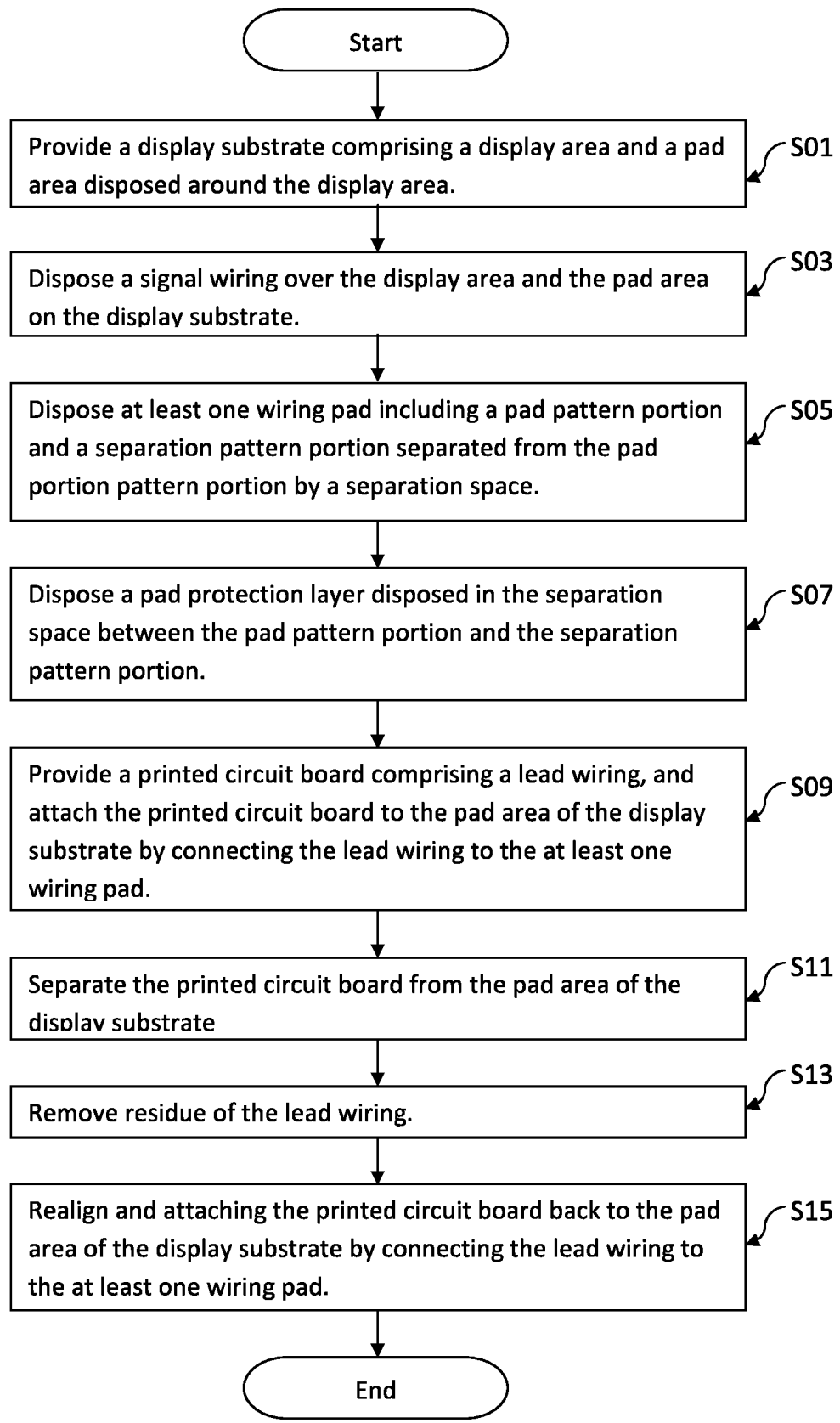

DISPLAY DEVICE AND METHOD OF MANUFACTURING THE SAME

CROSS-REFERENCE TO RELATED APPLICATION

This application claims priority from and the benefit of Korean Patent Application No. 10-2019-0007778, filed on Jan. 21, 2019, which is hereby incorporated by reference for all purposes as if fully set forth herein.

BACKGROUND

Field

Exemplary embodiments/implementations of the invention relate generally to a display device.

Discussion of the Background

A display device is a device for visually displaying data. The display device includes a substrate partitioned into a display area and a non-display area. A plurality of pixels are disposed on the substrate in the display area, and a plurality of pads and the like are disposed on the substrate in the non-display area. A flexible film (COF film) including a driving circuit and the like is coupled to the plurality of pads to transmit driving signals to the pixels.

The flexible film may include a plurality of leads coupled to the plurality of pads, and the leads may be bonded to the plurality of pads separated from each other. The bonding may be performed by an ultrasonic bonding process.

However, in a manufacturing process of a display device, after the bonding process, when a misalignment occurs between the plurality of leads and the plurality of pads, or when a defective driving circuit is mounted, the flexible film is separated from the plurality of pads. If there is damage to the plurality of pads bonded to the plurality of leads during the bonding process, it may be difficult to rework the plurality of pads.

The above information disclosed in this Background section is only for understanding of the background of the inventive concepts, and, therefore, it may contain information that does not constitute prior art.

SUMMARY

Devices constructed and methods performed according to exemplary implementations of the invention are capable of providing a display device including pads for rework in which the degree of damage is reduced even when they are separated from leads after being bonded to the leads.

Additional features of the inventive concepts will be set forth in the description which follows, and in part will be apparent from the description, or may be learned by practice of the inventive concepts.

According to one or more exemplary embodiments of the invention, a display device includes: a display substrate including a display area and a pad area disposed around the display area; a signal wiring disposed over the display area and the pad area on the display substrate; at least one wiring pad including: a pad pattern portion disposed on the pad area of the display substrate and electrically connected to the signal wiring; and a separation pattern portion separated from the pad pattern portion by a separation space; and a printed circuit board attached to the pad area of the display substrate, the printed circuit board including a lead wiring connected to the at least one wiring pad.

The display device may further include a pad protection layer disposed in the separation space between the pad pattern portion and the separation pattern portion.

The pad protection layer may include an organic insulating material.

The separation pattern portion may be separated from the pad pattern portion along a first direction.

The first direction may intersect a direction from an end portion of the pad area toward the display area, and a width of the pad pattern portion in the first direction may be larger than a width of the separation pattern portion in the first direction.

The at least one wiring pad further may include an edge pattern portion having a rectangular frame shape to surround the pad pattern portion and the separation pattern portion in a plan view.

The pad pattern portion, the separation pattern portion, and the edge pattern portion may be separated from each other, and The pad protection layer may be formed as a single piece in an area defined by the edge pattern portion in the plan view.

The edge pattern portion and the pad pattern portion may be physically connected to each other, and the edge pattern portion and the separation pattern portion may be physically connected to each other.

The pad protection layer may include a plurality of pad protective pattern portions which are separated from each other and disposed between the edge pattern portion and the separation pattern portion and between the separation pattern portion and the pad pattern portion.

The pad pattern portion may have a linear shape extending along a second direction intersecting the first direction, and a shape of the separation pattern portion in a plan view may be the same as a shape of the pad pattern portion in the plan view.

The second direction may be a direction from an distal end portion of the pad area toward the display area.

The at least one wiring pad may include a first wiring pad and a second wiring pad separated from each other, and the pad protection layer is further disposed between the first wiring pad and the second wiring pad in a plan view.

The display device may further include a via layer disposed between the first wiring pad and the second wiring pad on the display substrate, the pad protection layer overlaps the via layer.

The pad pattern portion and the separation pattern portion may be directly connected to the lead wiring.

The pad pattern portion and the separation pattern portion may be ultrasonically bonded to the lead wiring.

According to one or more exemplary embodiments of the invention, a display panel includes: a display substrate including a display area and a pad area disposed around the display area; a signal wiring disposed over the display area and the pad area on the display substrate; and at least one wiring pad comprising: a pad pattern portion disposed on the pad area of the display substrate and electrically connected to the signal wiring; and a separation pattern portion separated from the pad pattern portion by a separation space.

The display panel may further include a pad protection layer disposed in the separation space between the pad pattern portion and the separation pattern portion.

The pad protection layer may include an organic insulating material.

According to one or more exemplary embodiments of the invention, a printed circuit board includes a base film; a plurality of lead wirings disposed on the base film and including a plurality of lead pattern portions separated from each other; and a plurality of insulating patterns disposed between the plurality of lead pattern portions.

The plurality of insulating patterns may be disposed between the plurality of lead wirings, and the insulating patterns include an organic insulating material.

According to one or more exemplary embodiments of the invention, a method of manufacturing a display panel includes: providing a display substrate including a display area and a pad area disposed around the display area; disposing a signal wiring over the display area and the pad area on the display substrate; disposing at least one wiring pad including: a pad pattern portion on the pad area of the display substrate, the pad pattern portion electrically connected to the signal wiring; and a separation pattern portion separated from the pad portion pattern portion by a separation space; and disposing a pad protection layer disposed in the separation space between the pad pattern portion and the separation pattern portion.

The method may further include: providing a printed circuit board including a lead wiring; and attaching the printed circuit board to the pad area of the display substrate by connecting the lead wiring to the at least one wiring pad.

The attaching of the printed circuit board may further include ultrasonically bonding the lead wiring and the at least one wiring pad.

The method may further include: separating the printed circuit board from the pad area of the display substrate.

The method may further include: removing residue of the lead wiring left on the pad protection layer and the at least one wiring pad from separating the printed circuit board from the pad area of the display substrate.

The removing of the residue of the lead wiring may include: peeling the pad protection layer from the pad area to remove the residue disposed on the at least at least one wiring pad and the pad The method may further include: realigning and attaching the printed circuit board back to the pad area of the display substrate by connecting the lead wiring to the at least one wiring pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 24 is a flowchart of a method of manufacturing a display panel according to the exemplary embodiments.

DETAILED DESCRIPTION

Figure 1:
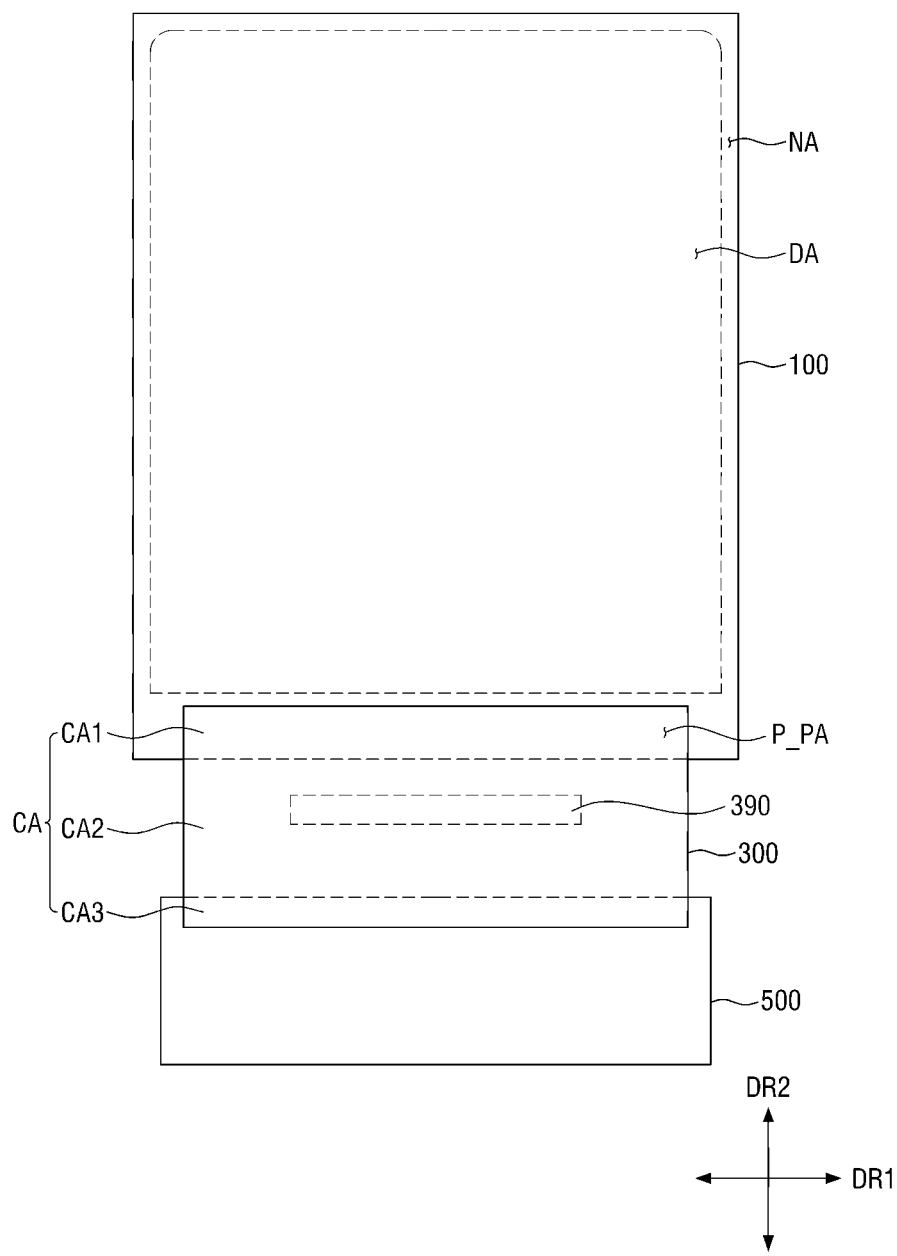
FIG. 1 is a plan view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
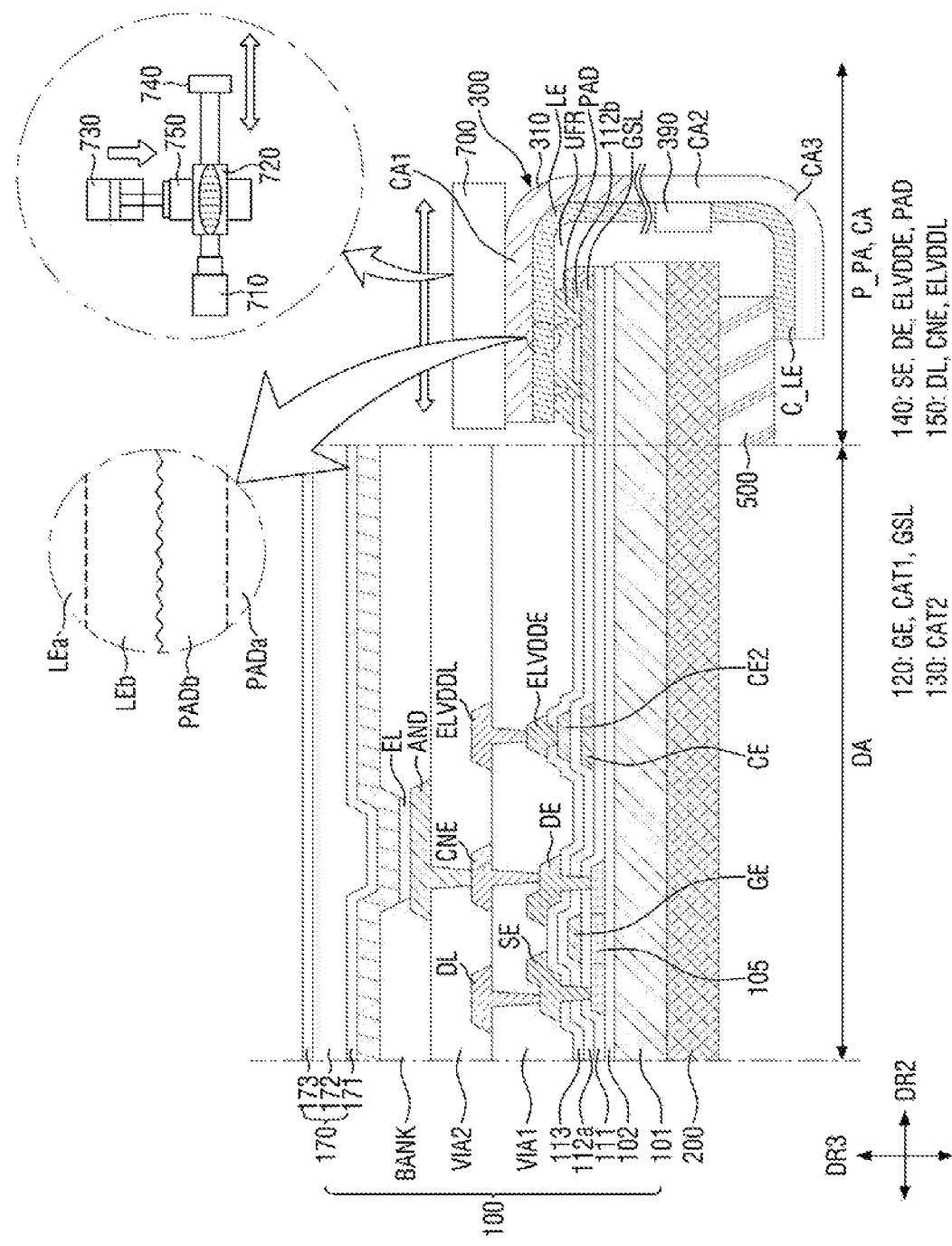
FIG. 2 is a cross-sectional view of the display device of FIG. 1.
Figure 3:
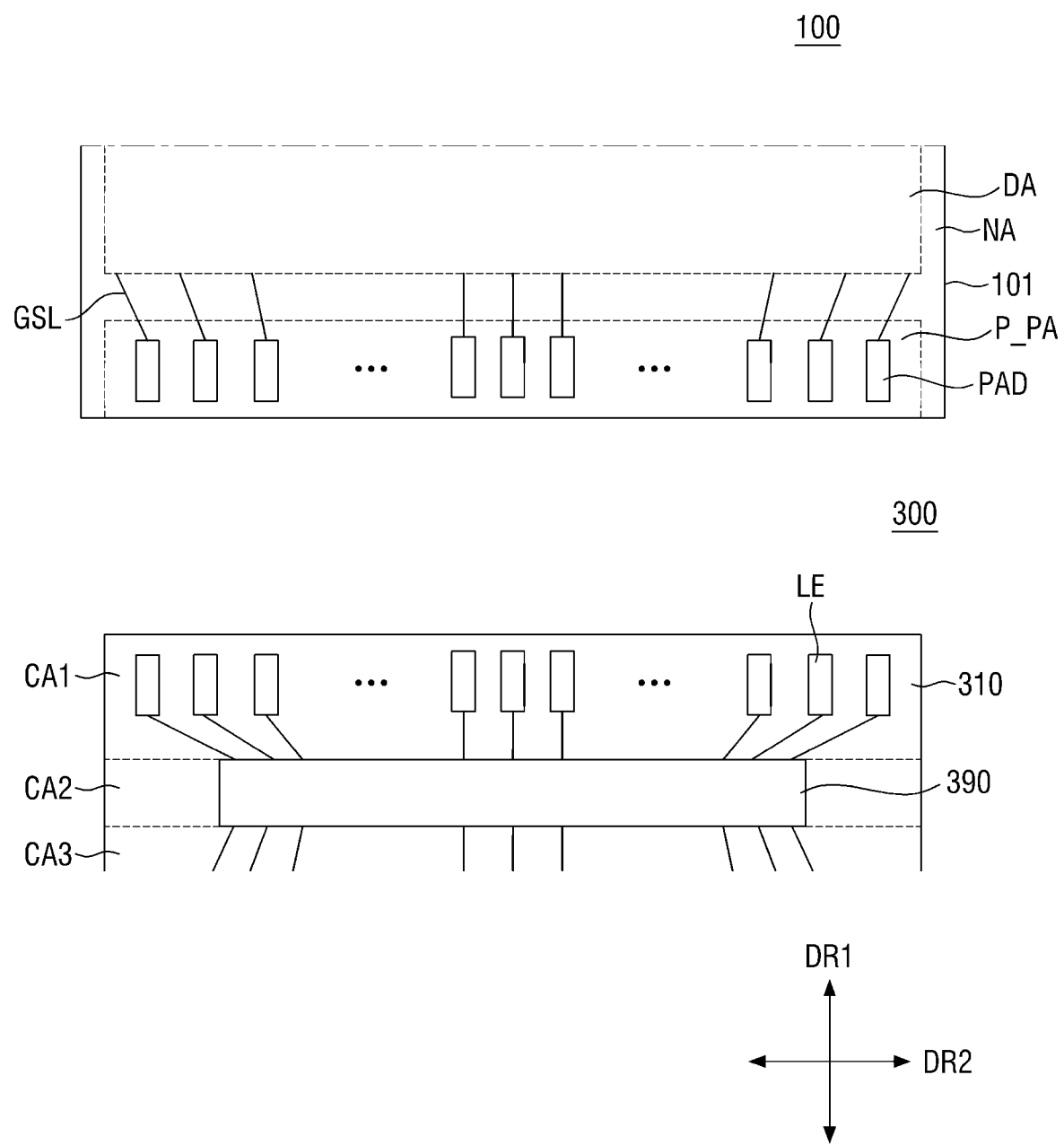
FIG. 3 is a plan layout diagram of a pad area and a partial plan layout diagram of a printed circuit board.
Figure 4:
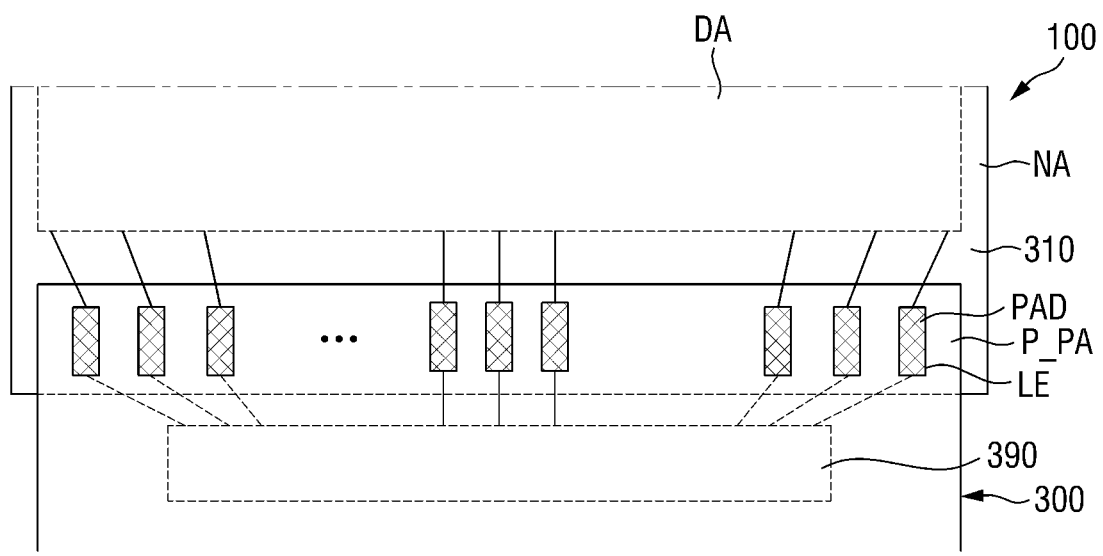
FIG. 4 is a schematic plan layout diagram of a pad area of a display panel and a printed circuit board attached to the pad area.
Figure 4:
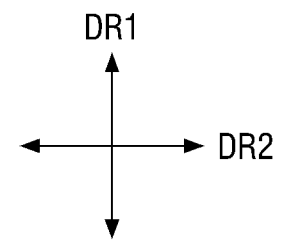

FIG. 1 is a plan view of a display device according to an exemplary embodiment. FIG. 2 is a cross-sectional view of the display device of FIG. 1. FIG. 3 is a plan layout diagram of a pad area and a partial plan layout diagram of a printed circuit board. FIG. 4 is a schematic plan layout diagram of a pad area of a display panel and a printed circuit board attached to the pad area.

A display device 1 is a device for displaying a moving image or a still image. The display device may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

Referring to FIGS. 1, 2, 3, and 4, the display device 1 may include a display panel 100 configured to display an image, a printed circuit board 300 connected to the display panel 100, and a main circuit board 500 connected to the printed circuit board 300.

The display panel 100 may be, for example, an organic light emitting display panel. In the following embodiments, a case where the organic light emitting display panel is applied as the display panel 100 will be exemplified, but the present disclosure is not limited thereto, and other types of display panels such as a liquid crystal display (LCD) panel, a quantum dot organic light emitting display (QD-OLED) panel, a quantum dot liquid crystal display (QD-LCD) panel, a quantum-nano light emitting display (QNED) panel and a micro LED panel may be applied as the display panel 100.

The display panel 100 includes a display area DA including a plurality of pixel areas and a non-display area NA disposed around the display area DA. The display area DA may have a rectangular shape having rounded corners or perpendicular corners in plan view. The display area DA may have short and long sides. The short side of the display area DA may be a side extending in a first direction DR1. The long side of the display area DA may be a side extending in a second direction DR2. However, the planar shape of the display area DA is not limited to a rectangular shape, but may have a circular shape, an elliptical shape, or various other shapes. The non-display area NA may be disposed adjacent to both short sides and both long sides of the display area DA. In this case, the edges of the display area DA may be formed to surround all sides of the display area DA. However, the exemplary embodiments are not limited thereto, and the non-display area NA may be disposed adjacent to both short sides or both long sides of the display area DA.

The non-display area NA of the display panel 100 further includes a panel pad area P_PA. The panel pad area P_PA may be disposed, for example, around one short side of the display area DA, but the exemplary embodiments are not limited thereto. The panel pad area P_PA may be disposed around both short sides of the display area DA, or may be disposed around both short sides and both long sides of the display area DA.

The printed circuit board 300 may include a printed base film 310 and a driving integrated circuit 390 disposed on the printed base film 310. The printed base film 310 may include an insulating material.

The printed circuit board 300 may include a first circuit area CA1 having one side attached to the panel pad area P_PA of the display panel 100, a second circuit area CA2 disposed on one side of the first circuit area CA1 in the second direction DR2, and a third circuit area CA3 which is disposed on one side of the second circuit area CA2 in the second direction DR2 and to which the main circuit board 500 is attached. The driving integrated circuit 390 may be disposed on one surface of the second circuit area CA2 of the printed circuit board 300. The driving integrated circuit 390 may be, for example, a data driving integrated circuit, and may be implemented as a data driving chip by applying a chip on film (COF) method.

The main circuit board 500 may include a circuit pad area attached to the third circuit area CA3 of the printed circuit board 300. A plurality of circuit pads may be disposed in the circuit pad area of the main circuit board 500 and connected to the lead wirings disposed in the third circuit area CA3 of the printed circuit board 300.

Referring to FIG. 2, the display device 1 further includes a panel lower sheet 200 disposed below the display panel 100. The panel lower sheet 200 may be attached to the back surface of the display panel 100. The panel lower sheet 200 includes at least one functional layer. The functional layer may be a layer that performs a heat dissipation function, an electromagnetic shielding function, a grounding function, a buffering function, a rigidity enhancing function, a supporting function, and/or a digitizing function. The functional layer may be a sheet layer, a film layer, a thin layer, a coating layer, a panel, a plate, or the like. One functional layer may be formed of a single layer, but may also be formed of a plurality of laminated thin films or coating layers. The functional layer may be, for example, a supporting substrate, a heat dissipation layer, an electromagnetic shielding layer, an impact absorbing layer, a digitizer, or the like.

The printed circuit board 300 may be bent downward in a third direction DR3 as shown in FIG. 2. The other side of the printed circuit board 300 and the main circuit board 500 may be located below the panel lower sheet 200. The lower surface of the panel lower sheet 200 may be coupled to the main circuit board 500 through an adhesive layer, but the exemplary embodiments are not limited thereto.

The display panel 100 may include a display substrate 101, a plurality of conductive layers, a plurality of insulating layers for insulating them, an organic layer (EL), and the like.

The display substrate 101 is disposed over the entire area of the display area DA and the non-display area NA. The display substrate 101 may function to support various elements disposed thereon. In one embodiment, the display substrate 101 may be a rigid substrate including a rigid material such as soft glass, quartz, or the like. However, the exemplary embodiments are not limited thereto, and the display substrate 101 may be a flexible substrate including a flexible material such as polyimide (PI).

A buffer layer 102 may be disposed on the display substrate 101. The buffer layer 102 can prevent penetration of moisture and oxygen from the outside through the display substrate 101. The buffer layer 102 may include any one of a silicon nitride (SiNx) layer, a silicon oxide ($SiO_2$) layer and a silicon oxynitride (SiOxNy) layer.

A semiconductor layer 105 may be disposed on the buffer layer 102. The semiconductor layer 105 forms a channel of a thin film transistor. The semiconductor layer 105 is disposed in each pixel of the display area DA, and may be disposed in the non-display area NA in some cases. The semiconductor layer 105 may include a source/drain region and an active region. The semiconductor layer 105 may include polycrystalline silicon.

A first insulating layer 111 may be disposed on the semiconductor layer 105. The first insulating layer 111 may be disposed over the entire surface of the display substrate 101. The first insulating layer 111 may be a gate insulating layer having a gate insulating function. The first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. These may be used alone or in combination with each other.

A first conductive layer 120 may be disposed on the first insulating layer 111. The first conductive layer 120 may include a gate electrode GE of a thin film transistor TFT, a first electrode CE1 of a storage capacitor Cst, and a gate signal line GSL. The gate signal lines GSL may be arranged to pass through the display area DA and the panel pad area P_PA. The first conductive layer 120 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 120 may be a single layer or a multilayer stack of the above-exemplified material(s).

Second insulating layers 112a and 112b may be disposed on the first conductive layer 120. The second insulating layers 112a and 112b may insulate the first conductive layer 120 from the second conductive layer 130. The second insulating layer 112a may be disposed substantially in the display area DA and the second insulating layer 112b may be disposed substantially in the panel pad area P_PA. The second insulating layers 112a and 112b may be selected from the above-exemplified materials of the first insulating layer 111. In the panel pad area P_PA, the second insulating layer 112b may include a plurality of contact holes CNT partially exposing the gate signal line GSL. Although FIG. 2 illustrates that the second insulating layer 112b includes two contact holes CNT, the exemplary embodiments are not limited thereto, and the second insulating layer 112b may include one or three or more contact holes CNT.

A second conductive layer 130 may be disposed on the second insulating layers 112a and 112b. The second conductive layer 130 may include a second electrode CE2 of the storage capacitor Cst. The material of the second conductive layer 130 may be selected from the above-exemplified materials of the first conductive layer 120. The first electrode CE1 of the storage capacitor Cst and the second electrode CE2 of the storage capacitor Cst may form a capacitor through the second insulating layers 112a and 112b.

A third insulating layer 113 may be disposed on the second conductive layer 130. The third insulating layer 113 may include at least one of the above-exemplified materials of the first insulating layer 111. In some embodiments, the third insulating layer 113 may include an organic insulating material. The organic insulating material may be selected from exemplary materials of a first via layer VIA1 to be described later.

A third conductive layer 140 may be disposed on the third insulating layer 113. The third conductive layer 140 may include a source electrode SE, a drain electrode DE, a high potential voltage electrode ELVDDE and a wiring pad PAD. The third conductive layer 140 may include at least one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 140 may be a single layer made of the above-exemplified material. Without being limited thereto, the third conductive layer 140 may be a multilayer stack. For example, the third conductive layer 140 may have a stacked structure of Ti/Al/Ti, Mo/Al/Mo, Mo/AlGe/Mo, or Ti/Cu. In one embodiment, the third conductive layer 140 may include Ti/Al/Ti.

The wiring pad PAD of the third conductive layer 140 may be disposed to overlap the gate signal line GSL of the first conductive layer 120 in the thickness direction, and may be electrically connected to the gate signal line GSL through the contact holes CNT of the second insulating layer 112b.

The first via layer VIA1 may be disposed on the third conductive layer 140. The first via layer VIA1 may include an organic insulating material. The organic insulating material may include at least one selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

Meanwhile, the upper structures of the third insulating layer 113 and the third conductive layer 140 may be omitted or removed from a part of the wiring pad PAD on the panel pad area P_PA. Thus, the omitted or removed structures may expose the wiring pad PAD disposed in the panel pad area P_PA.

The printed circuit board 300 further includes a lead wiring LE on one surface of the first circuit area CA1 of the printed base film 310 and a circuit lead wiring C_LE on one surface of the third circuit area CA3. The lead wiring LE is connected to the wiring pad PAD. In one embodiment, the lead wiring LE may be directly connected to the upper surface of the exposed wiring pad PAD. For example, the lead wiring LE may be ultrasonically bonded to the wiring pad PAD.

Meanwhile, the ultrasonic bonding may be performed through an ultrasonic device 700. The ultrasonic device 700 may include a vibration generating unit 710, a vibrating unit 720 connected to the vibration generating unit 710, a pressing unit 730 for amplifying the vibration amplitude of the vibrating unit 720, and a vibration transmitting unit 740 connected to the vibrating unit 720.

The vibration generating unit 710 may convert electrical energy into vibrational energy. The vibrating unit 720 may vibrate with the vibrational energy converted by the vibration generating unit 710. The vibrating unit 720 may vibrate with a predetermined amplitude in a predetermined vibration direction. In the vibrating unit 720, the amplitude may be amplified in a direction parallel to the vibration direction through the pressing unit 730 connected to the vibrating unit 720. The vibration transmitting unit 740 may transmit the vibration of the vibrating unit 720 to a target object for ultrasonic bonding. A supporter 550 fixes the upper surface and the lower surface of the vibrating unit 720 so that the vibrating unit 720 and the vibration transmitting unit 740 can be prevented from moving up and down due to the vibration.

In one embodiment, the ultrasonic device 700 is in contact with the other surface of the printed circuit board 300 and maintains a constant pressurized state in a downward direction, so that the vibration transmitting unit 740 effectively transmits the vibration to the printed circuit board 300. In this case, the vibration transmitting unit 740 of the ultrasonic device 700 may perform ultrasonic bonding while overlapping the entire region of the printed circuit board 300 disposed therebelow, as shown in FIG. 2.

The ultrasonic device 700 may vibrate in a predetermined vibration direction to vibrate the lead wiring LE in the vibration direction. However, in this case, the wiring pad PAD may vibrate slightly in the vibration direction due to the vibration transmitted through the lead wiring LE, but the amplitude of the vibration may be small. Therefore, the vibration amplitude of the vibration transmitting unit 740 in the vibration direction may be substantially equal to a distance at which the lead wiring LE has moved on the wiring pad PAD in the vibration direction. In one embodiment, the vibration direction may be the second direction DR2. That is, the vibration direction may be an extending direction of the long sides of the lead wiring LE and the wiring pad PAD.

When the lead wiring LE is ultrasonically vibrated on one surface of the wiring pad PAD, a predetermined frictional force may be generated at an interface between one surface of the wiring pad PAD and one surface of the lead wiring LE, and frictional heat may be generated due to the frictional force. If the frictional heat is sufficient to melt the materials of the wiring pad PAD and the lead wiring LE, a pad molten region PADb of the wiring pad PAD adjacent to the lead wiring LE and a lead molten region LEb of the lead wiring LE adjacent to the wiring pad PAD may be melted. That is, the wiring pad PAD may include a pad non-molten region PADa and the pad molten region PADb. Further, the lead wiring LE may include a lead non-molten region LEa and the lead molten region LEb.

The pad non-molten region PADa may be a region containing only the material included in the wiring pad PAD. The lead non-molten region LEa may be a region containing only the material included in the lead wiring LE.

The pad molten region PADb may be a region where the material contained in the lead wiring LE is diffused such that the material of the wiring pad PAD and the material of the lead wiring LE are mixed. The lead molten region LEb may be a region where the material contained in the wiring pad PAD is diffused such that the material of the lead wiring LE and the material of the wiring pad PAD are mixed.

In the pad molten region PADb and the lead molten region LEb, the wiring pad PAD and the lead wiring LE may be combined through solidification. The interface between the wiring pad PAD and the lead wiring LE, i.e., the interface between the pad molten region PADb and the lead molten region LEb, may have a non-flat (or non-even) shape or rough surface.

For example, the lead wiring LE may include a metal material. Each lead wiring LE may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In the illustrated embodiment, the lead wiring LE may include copper (Cu) and gold (Au). That is, the lead wiring LE may include copper (Cu) disposed on the printed base film 310 and gold (Au) disposed on the copper (Cu). In this case, copper (Cu) directly disposed on the printed base film 310 may not be directly connected to the wiring pad PAD, but the exemplary embodiments are not limited thereto, and it may be directly connected to a part of the wiring pad PAD. Further, gold (Au) disposed on the copper (Cu) may be directly connected to the wiring pad PAD. In this case, the pad molten region PADb may be a region where Ti/Al/Ti of the wiring pad PAD and gold (Au) and/or copper (Cu) of the lead wiring LE are mixed, and the lead molten region LEb may be a region where the material contained in the wiring pad PAD is diffused such that gold (Au) and/or copper (Cu) of the lead wiring LE and Ti/Al/Ti of the wiring pad PAD are mixed.

Meanwhile, after the ultrasonic bonding between the wiring pad PAD of the panel pad area P_PA and the lead wiring LE of the printed circuit board 300, when a misalignment occurs between the wiring pad PAD and the lead wiring LE or when a failure occurs in the driving integrated circuit 390 which transmits a signal to the lead wiring LE, the plurality of lead wirings LE of the printed circuit board 300 may be separated from the plurality of wiring pads PAD of the panel pad area P_PA. However, in this case, if there is damage to the plurality of wiring pads PAD which have been bonded to the plurality of lead wirings LE during the ultrasonic bonding process, it may be difficult to rework the plurality of wiring pads PAD. Typically, the material of the lead wiring LE may have higher rigidity than the material of the wiring pad PAD. In the illustrated embodiment, gold (Au) of the lead wiring LE directly connected to the wiring pad PAD may have higher rigidity than aluminum (Al) included in the wiring pad PAD. As a result, when the plurality of lead wirings LE are separated from the plurality of wiring pads PAD after the ultrasonic bonding between the plurality of lead wirings LE and the plurality of wiring pads PAD, the wiring pads PAD may be partially damaged due to the lead wirings LE having higher rigidity than the constituent material of the wiring pads PAD.

To this end, the wiring pads PAD may include a plurality of pattern portions separated from each other, and a pad protection layer 600 (see FIG. 5) may be disposed between the plurality of pattern portions. The pad protection layer 600 can reduce the damage of the wiring pads PAD due to the lead wirings LE. In addition, the residues of the lead wirings LE remaining after the separation of the lead wirings LE can be easily removed through a separation process of the pad protection layer 600. A detailed description thereof will be given later.

A fourth conductive layer 150 may be disposed on the first via layer VIA1. The fourth conductive layer 150 may include a data line DL, a connection electrode CNE, and a high potential voltage wiring ELVDDL. The data line DL may be electrically connected to the source electrode SE of the thin film transistor TFT through the contact hole passing through the first via layer VIA1. The connection electrode CNE may be electrically connected to the drain electrode DE of the thin film transistor TFT through a contact hole passing through the first via layer VIA1. The high potential voltage wiring ELVDDL may be electrically connected to the high potential voltage electrode ELVDDE through a contact hole passing through the first via layer VIA1. The fourth conductive layer 150 may include a material selected from the exemplary materials of the third conductive layer 140.

A second via layer VIA2 is disposed on the fourth conductive layer 150. The second via layer VIA2 may include at least one of the above-exemplified materials of the first via layer VIA1.

An anode electrode ANO is disposed on the second via layer VIA2. The anode electrode ANO may be electrically connected to the connection electrode CNE through a contact hole passing through the second via layer VIA2.

A bank layer BANK may be disposed on the anode electrode ANO. The bank layer BANK may include a contact hole exposing the anode electrode ANO. The bank layer BANK may be formed of an organic insulating material or an inorganic insulating material. For example, the bank layer BANK may include at least one of a photoresist, a polyimide resin, an acrylic resin, a silicon compound, a polyacrylic resin, and the like.

An organic layer EL may be disposed in the opening of the bank layer BANK on the upper surface of the anode electrode ANO. A cathode electrode CAT is disposed on the organic layer EL and the bank layer BANK. The cathode electrode CAT may be a common electrode disposed over a plurality of pixels.

A thin film encapsulation layer 170 is disposed on the cathode electrode CAT. The thin film encapsulation layer 170 may cover an organic light emitting element OLED. The thin film encapsulation layer 170 may be a laminated film in which inorganic films and organic films are alternately laminated. For example, the thin film encapsulation layer 170 may include a first encapsulation inorganic film 171, an encapsulation organic film 172, and a second encapsulation inorganic film 173 which are sequentially stacked.

Meanwhile, the stacked structure and shape of the gate signal lines GSL and the wiring pads PAD in the panel pad area P_PA may be modified.

For example, in some embodiments, the gate signal lines GSL may include a plurality of patterns, and the wiring pads PAD disposed on the gate signal lines GSL may have surface irregularities reflecting a height difference of the patterns of the gate signal lines GSL.

In some embodiments, an auxiliary pad of the second conductive layer 130 may be further disposed between the gate signal line GSL and the wiring pad PAD. In this case, the planar size of the auxiliary pad PAD may be smaller than the planar size of the wiring pad PAD. The wiring pad PAD, the auxiliary pad, and the gate signal line GSL may be electrically connected to each other while overlapping each other in the thickness direction.

In some embodiments, the gate signal line GSL may be formed of the second conductive layer 130, and the wiring pad PAD may be formed of the fourth conductive layer 150.

Referring to FIG. 3, the wiring pad PAD may be provided plurally, and the plurality of wiring pads PAD may be arranged along the first direction DR1. The plurality of wiring pads PAD may include, for example, a power supply pad, a data pad, and a panel dummy pad. The first direction DR1 may be a direction from an end portion of the panel pad area P_PA toward the display area DA. The second direction DR2 refers to a direction intersecting the first direction DR2.

Further, the lead wiring LE disposed in the first circuit area CA1 may be provided plurally, and the plurality of lead wirings LE may be arranged along the first direction DR1. The plurality of lead wirings LE may include a power lead wiring, a data lead wiring, and a dummy lead.

Referring to FIG. 4, the plurality of wiring pads PAD may be connected to the plurality of lead wirings LE. For example, the wiring pads PAD may be directly connected and ultrasonically bonded to the lead wirings LE. The first circuit area CA1 of FIG. 4 inverted by 180° is attached to the panel pad area P_PA of FIG. 3 in the thickness direction.

Hereinafter, the specific shape of the wiring pad PAD and the pad protection layer 600 disposed between the plurality of pattern portions of the wiring pads PAD will be described.

Figure 5:
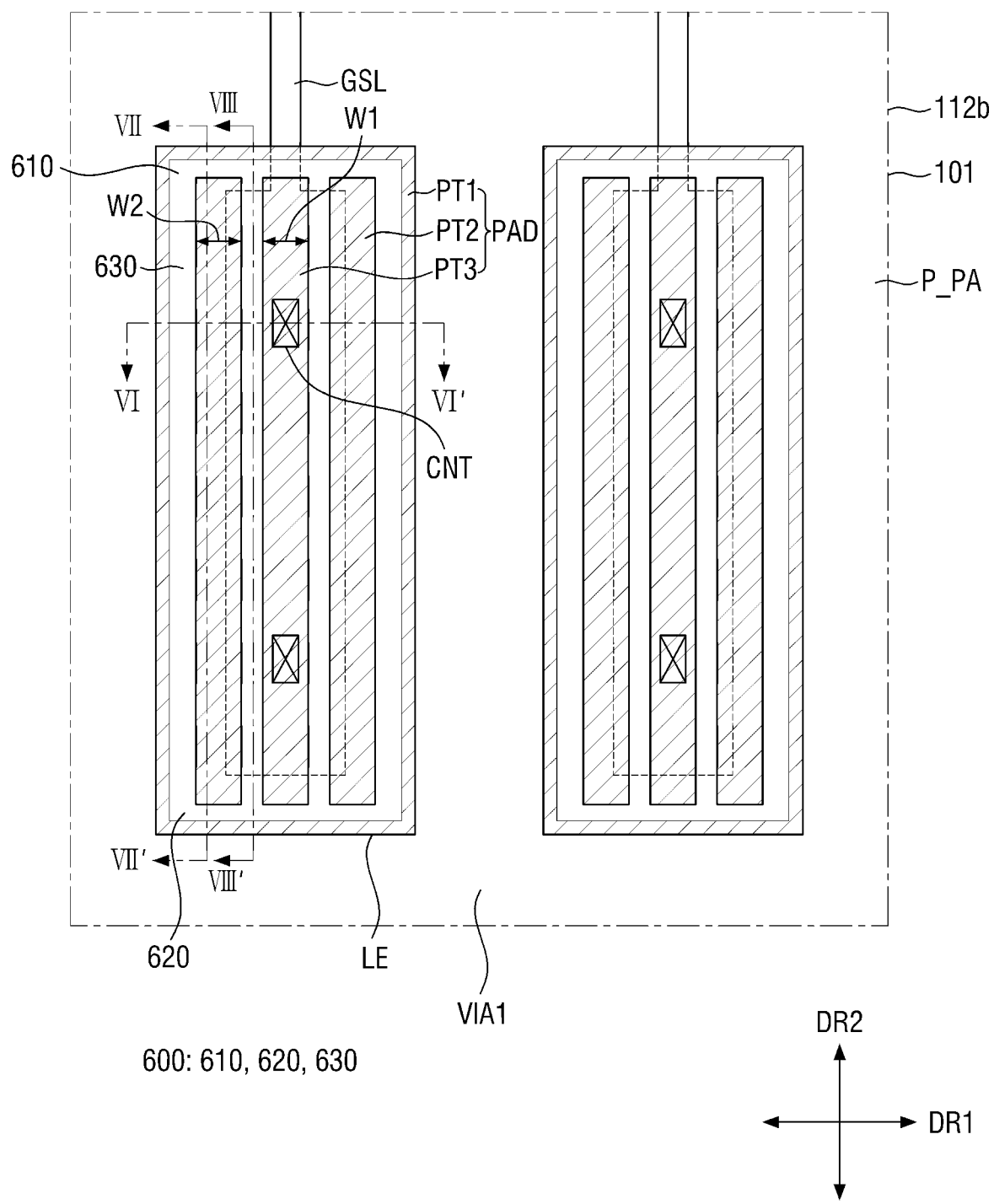
FIG. 5 is an enlarged plan view of FIG. 4.
Figure 6:
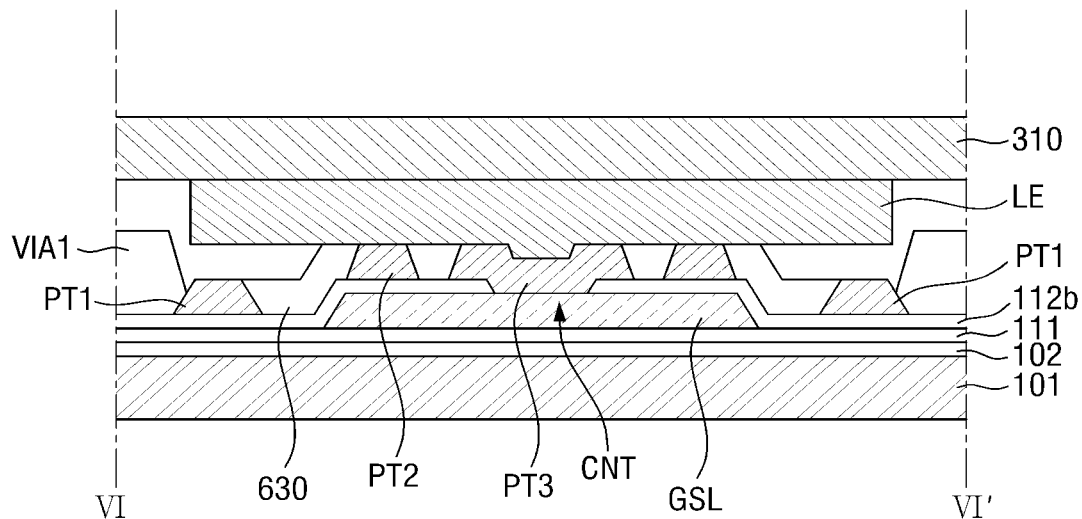
FIG. 6 is a cross-sectional view taken along a sectional line VI-VI' of FIG. 5.
Figure 7:
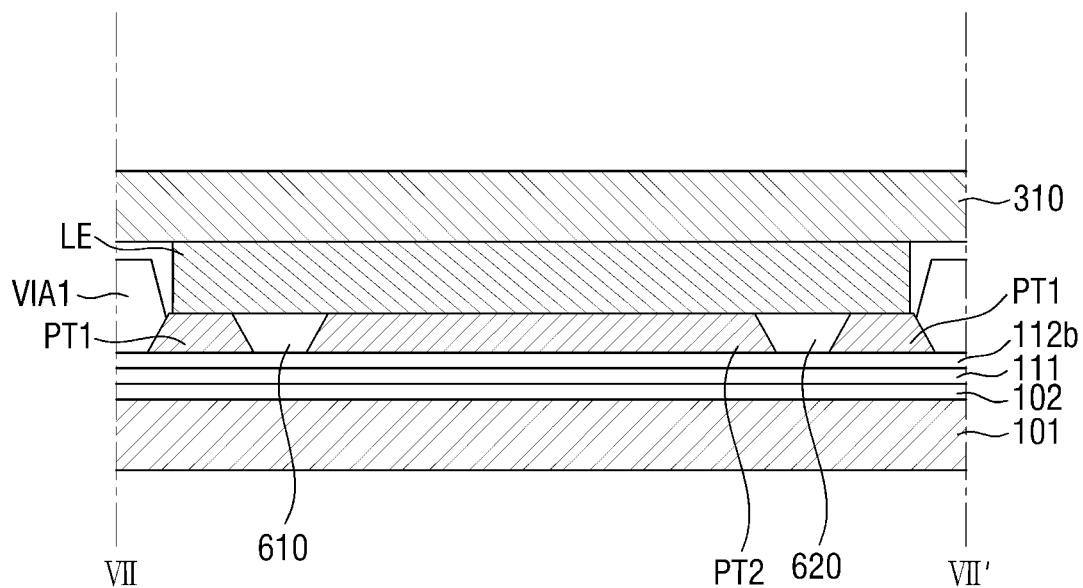
FIG. 7 is a cross-sectional view taken along a sectional line VII-VII' of FIG. 5.
Figure 8:
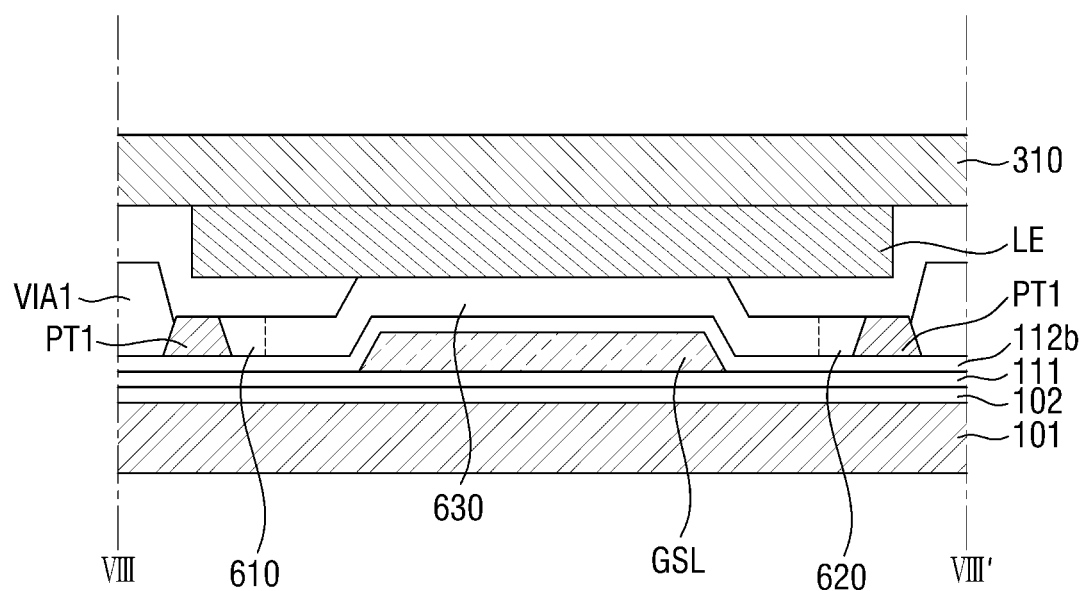
FIG. 8 is a cross-sectional view taken along a sectional line VIII-VIII' of FIG. 5.

FIG. 5 is an enlarged plan view of FIG. 4. FIG. 6 is a cross-sectional view taken along a sectional line VI-VI' of FIG. 5. FIG. 7 is a cross-sectional view taken along a sectional line VII-VII' of FIG. 5. FIG. 8 is a cross-sectional view taken along a sectional line VIII-VIII' of FIG. 5.

FIGS. 5, 6, 7, and 8 show a case where the printed circuit board 300 is aligned positively and attached on the panel pad area P_PA in a state where the pad protection layer 600 disposed between the plurality of pattern portions of the wiring pads PAD.

Referring to FIGS. 5, 6, 7, and 8, the gate signal line GSL may be disposed from the display area DA to the panel pad area P_PA, and may have a width which increases in the first direction DR1 in a region overlapping the wiring pad PAD of the panel pad area P_PA.

The first via layer VIA1 disposed on the third conductive layer 140 may be disposed in the vicinity of the wiring pad PAD. The first via layer VIA1 may be disposed between adjacent wiring pads PAD. As shown in FIGS. 6, 7, and 8, the first via layer VIA1 may be disposed to partially overlap the wiring pad PAD. That is, the first via layer VIA1 may be disposed to partially overlap the leftmost, rightmost, uppermost and lowermost regions of the wiring pad PAD in plan view.

One wiring pad PAD may include a plurality of pattern portions PT1, PT2 and PT3 separated from each other. The first pad pattern portion PT1 of the wiring pad PAD may surround the second pad pattern portion PT2 and the third pad pattern portion PT3 in plan view. The first pad pattern portion PT1 may be separated from the second pad pattern portion PT2 and the third pad pattern portion PT3. The first pad pattern portion PT1 may have a rectangular frame shape in plan view, but the exemplary embodiments are not limited thereto and other shapes may be applied. When the first pad pattern portion PT1 is applied in a rectangular frame shape in plan view, the first pad pattern portion PT1 may include short sides extending in the first direction DR1 and long sides extending in the second direction DR2, but the exemplary embodiments are not limited thereto. The first pad pattern portion PT1 may be an edge pattern portion surrounding the second and third pad pattern portions PT2 and PT3.

The second pad pattern portion PT2 of the wiring pad PAD may be separated from the first pad pattern portion PT1 and the third pad pattern portion PT3 of the wiring pad PAD. The second pad pattern portion PT2 may be disposed between the first pad pattern portion PT1 and the third pad pattern portion PT3. The second pad pattern portion PT2 may partially overlap the gate signal line GSL disposed therebelow, but the exemplary embodiments are not limited thereto. The second pad pattern portion PT2 may not be directly connected to the gate signal line GSL disposed below, unlike the third pad pattern portion PT3 to be described later. That is, the second insulating layer 112b disposed on the panel pad area P_PA may be disposed to overlap the second pad pattern portion PT2, and the contact holes CNT of the second insulating layer 112b may not be disposed below the second pad pattern portion PT2. However, the second pad pattern portion PT2 may be connected to the lead wiring LE to be described later to be electrically connected to the gate signal line GSL through the third pad pattern portion PT3 connected to the lead wiring LE.

The second pad pattern portions PT2 of the wiring pad PAD may be separated from each other with the third pad pattern portion PT3 interposed therebetween. The second pad pattern portion PT2 may be a separation pattern portion spaced apart from the third pad pattern portion PT3. Although it is illustrated in FIG. 5 that the second pad pattern portion PT2 includes two pattern portions with the third pad pattern portion PT3 interposed therebetween, the exemplary embodiments are not limited thereto. The second pad pattern portion PT2 may include one or three more pattern portions.

The second pad pattern portion PT2 of the wiring pad PAD may have a linear shape extending in one direction. For example, the second pad pattern portion PT2 may have a linear shape extending in the second direction DR2. In some embodiments, the second pad pattern portion PT2 may have a shape including at least one bent portion, for example, a bent portion bent in the first direction DR1, while extending in the second direction DR2. For example, the second pad pattern portion PT2 may extend in a zigzag shape or a serpentine shape in the second direction DR2, but the exemplary embodiments are not limited thereto.

The third pad pattern portion PT3 of the wiring pad PAD may be disposed between the adjacent second pad pattern portions PT2. The third pad pattern portion PT3 may be separated from the first pad pattern portion PT1 and the second pad pattern portion PT2 as described above.

The third pad pattern portion PT3 may be disposed to overlap the gate signal line GSL disposed therebelow. The third pad pattern portion PT3 may be electrically connected to the gate signal line GSL through the plurality of contact holes CNT of the second insulating layer 112b below the third pad pattern portion PT3.

The third pad pattern portion PT3 may have substantially the same shape as or similar to the shape of the second pad pattern portion PT2 described above. That is, the third pad pattern portion PT3 of the wiring pad PAD may have a linear shape extending in one direction. For example, the third pad pattern portion PT3 may have a linear shape extending in the second direction DR2. In some embodiments, the third pad pattern portion PT3 may have a shape including at least one bent portion, for example, a bent portion bent in the first direction DR1, while extending in the second direction DR2. For example, the third pad pattern portion PT3 may extend in a zigzag shape or a serpentine shape in the second direction DR2, but the exemplary embodiments are not limited thereto. Although FIG. 5 illustrates one third pad pattern portion PT3 extended in one direction, the exemplary embodiments are not limited thereto, and two or more third pad pattern portions PT3 may be provided.

In the illustrated embodiment, a width W1 of the third pad pattern portion PT3 in the first direction DR1 in plan view may be larger than a width W2 of the second pad pattern portion PT2 in the first direction DR1 in plan view. As described above, the third pad pattern portion PT3 may be electrically connected to the gate signal line GSL disposed therebelow. Thereafter, when the lead wiring LE of the printed circuit board 300 is connected to each of the second pad pattern portion PT2 and the third pad pattern portion PT3, as described above, the third pad pattern portion PT3 serves to electrically connect the signal applied from the lead wiring LE of the printed circuit board 300 to the gate signal line GSL, and since the width W1 of the third pad pattern portion PT3 is larger than the width W2 of the second pad pattern portion PT2, it is possible to prevent the entire resistance of the wiring pad PAD from increasing.

The pad protection layer 600 may be disposed between the plurality of pattern portions PT1, PT2 and PT3 of one wiring pad PAD as described above. That is, the pad protection layer 600 may be disposed between the first pad pattern portion PT1 and the second pad pattern portion PT2, between the first pad pattern portion PT1 and the third pad pattern portion PT3, and between the pad pattern portion PT2 and the third pad pattern portion PT3. The pad protection layer 600 may be provided as a film including a plurality of patterns, but the exemplary embodiments are not limited thereto.

As described above, after the ultrasonic bonding between the wiring pad PAD and the lead wiring LE of the printed circuit board 300, when a misalignment occurs between the wiring pad PAD and the lead wiring LE or when a failure occurs in the driving integrated circuit 390 which transmits a signal to the lead wiring LE and the lead wirings LE of the printed circuit board 300 are separated from the wiring pads PAD of the panel pad area P_PA, the wiring pad PAD may be damaged due to the lead wiring LE because the constituent material of the lead wiring LE has higher rigidity than the constituent material of the wiring pad PAD.

The pad protection layer 600 may serve to reduce the damage of the wiring pad PAD by the lead wiring LE during the ultrasonic bonding between the lead wiring LE and the wiring pad PAD. That is, in the ultrasonic bonding process, the lead wiring LE is in direct contact with not only the wiring pad PAD but also the adjacent pad protection layer 600, and the pad protection layer 600 may include a material capable of partially alleviating the physical pressure of the lead wiring LE. For example, the pad protection layer 600 may include an organic insulating material. In one embodiment, the pad protection layer 600 may include polyimide (PI).

Further, the pad protection layer 600 may be in surface contact with the lead wiring LE disposed thereon during the ultrasonic process. That is, the lead wiring LE disposed on the pad protection layer 600 is in contact with not only the panel pad PAD but also the pad protection layer 600 during the ultrasonic process, and it may serve to maintain a proper coupling depth between the lead wiring LE and the wiring pad PAD in order to partially prevent the lead wiring LE from penetrating deeply into the wiring pad PAD in the downward direction and being coupled thereto. Accordingly, it is possible to reduce the degree of damage to the plurality of wiring pads PAD by the plurality of lead wirings LE even if the plurality of lead wirings LE are separated from the plurality of wiring pads PAD after the ultrasonic process.

The pad protection layer 600 may be disposed in the separation spaces between the pattern portions PT1, PT2 and PT3 of the wiring pad PAD. That is, the pad protection layer 600 may include a first protective pattern portion 610 and a second protective pattern portion 620, which are disposed between the first pad pattern portion PT1 and the second pad pattern portion PT2 and the third pad pattern portion PT3 of the wiring pad PAD and extend in the first direction DR1, and a third protective pattern portion 630 which is disposed between the first pad pattern portion PT1 and the second pad pattern portion PT2 and between the second pad pattern portion PT2 and the third pad pattern portion PT3 and connected to the first protective pattern portion 610 and the second protective pattern portion 620.

The first protective pattern portion 610 may be disposed closer to the display area DA than the second protective pattern portion 620. That is, the first protective pattern portion 610 may be disposed between the second pad pattern portion PT2 and the third pad pattern portion PT3 adjacent to the upper short side of the first pad pattern portion PT1, and the second protective pattern portion 620 may be disposed between the second pad pattern portion PT2 and the third pad pattern portion PT3 adjacent to the lower short side of the first pad pattern portion PT1.

Although FIG. 5 illustrates that the number of the third protective pattern portions 630 is four, the exemplary embodiments are not limited thereto, and the number of the third protective pattern portions 630 may be one to three, and may be five or more.

The first protective pattern portion 610 and the second protective pattern portion 620 may have a linear shape extending in the first direction DR1, and the third protective pattern portion 630 may be different depending on the planar shape of the adjacent pad pattern portions PT1, PT2 and PT3. FIG. 5 illustrates that the third protective pattern portion 630 has a linear shape extending in the second direction DR2. In some embodiments, the third protective pattern portion 630 may extend in the second direction DR2 and include at least one bent portion. For example, the third protective pattern portion 630 may have a zigzag shape or a serpentine shape extending in the second direction DR2.

The pad protection layer 600 may be formed integrally as a single piece in plan view. That is, as described above, the third protective pattern portion 630 may physically connect the first protective pattern portion 610 and the second protective pattern portion 620 disposed on the upper side and the lower side.

The wiring pad PAD and the pad protection layer 600 may include prominences and depressions on their surfaces. The prominences of the wiring pad PAD and the pad protection layer 600 may be regions overlapping the second insulating layer 112b in the thickness direction, and the depressions of the wiring pad PAD and the pad protection layer 600 may be regions not overlapping the second insulating layer 112b in the thickness direction.

Further, in the regions of the wiring pad PAD and the pad protection layer 600 overlapping the second insulating layer 112b in the thickness direction, a region overlapping the gate signal line GSL disposed therebelow may further protrude upward, e.g., in the third direction DR3, from a region not overlapping the gate signal line GSL disposed therebelow.

The printed circuit board 300 including the lead wiring LE may be disposed on the wiring pad PAD and the pad protection layer 600. The lead wiring LE may be in contact with at least a part of the wiring pad PAD and the pad protection layer 600. That is, referring to FIGS. 6, 7, and 8, the lead wiring LE may be in contact with the second pad pattern portion PT2 and the third pad pattern portion PT3 of the wiring pad PAD, and may be in contact with at least a part of the first protective pattern portion 610, the second protective pattern portion 620 and the third protective pattern portion 630 of the pad protection layer 600. The lead wiring LE in contact with the wiring pad PAD may be electrically connected and ultrasonically bonded to the wiring pad PAD. However, unlike the illustrated embodiment, the lead wiring LE may be connected to the first pad pattern portion PT1 of the wiring pad PAD, and may be in full contact with the first protective pattern portion 610 to the third protective pattern portion 630 of the pad protection layer 600, but the exemplary embodiments are not limited thereto.

Hereinafter, a display device according to an embodiment will be described. In the following embodiment, the same components as those of the above-described embodiment are denoted by the same reference numerals, and a description thereof will be omitted or simplified.

In the present exemplary embodiment, a case where the lead wiring LE of the printed circuit board 300 is separated from the wiring pad PAD of the panel pad area P_PA due to a misalignment between the lead wiring LE and the wiring pad PAD and/or a failure in the driving integrated circuit 390 will be described. In the following description, a case where a misalignment occurs between the wiring pad PAD and the lead wiring LE will be described as an example.

Figure 9:
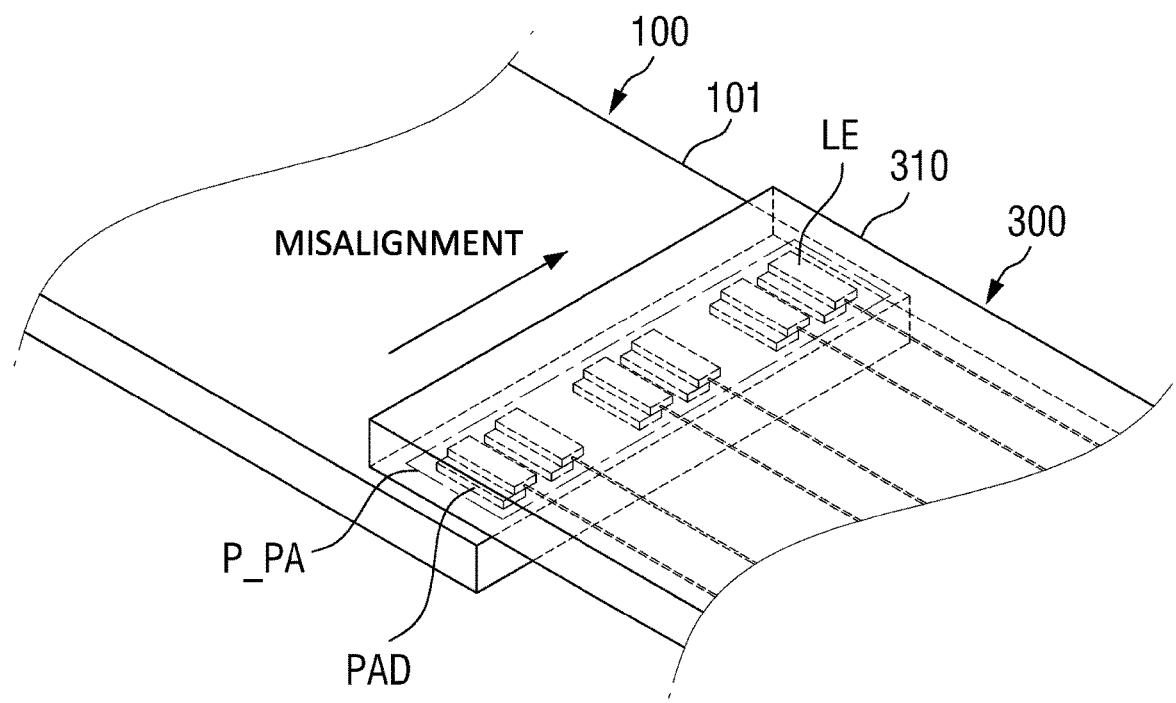
FIG. 9 is a perspective view showing a case where a misalignment has occurred between a plurality of leads of a printed circuit board and wiring pads of a display panel.
Figure 10:
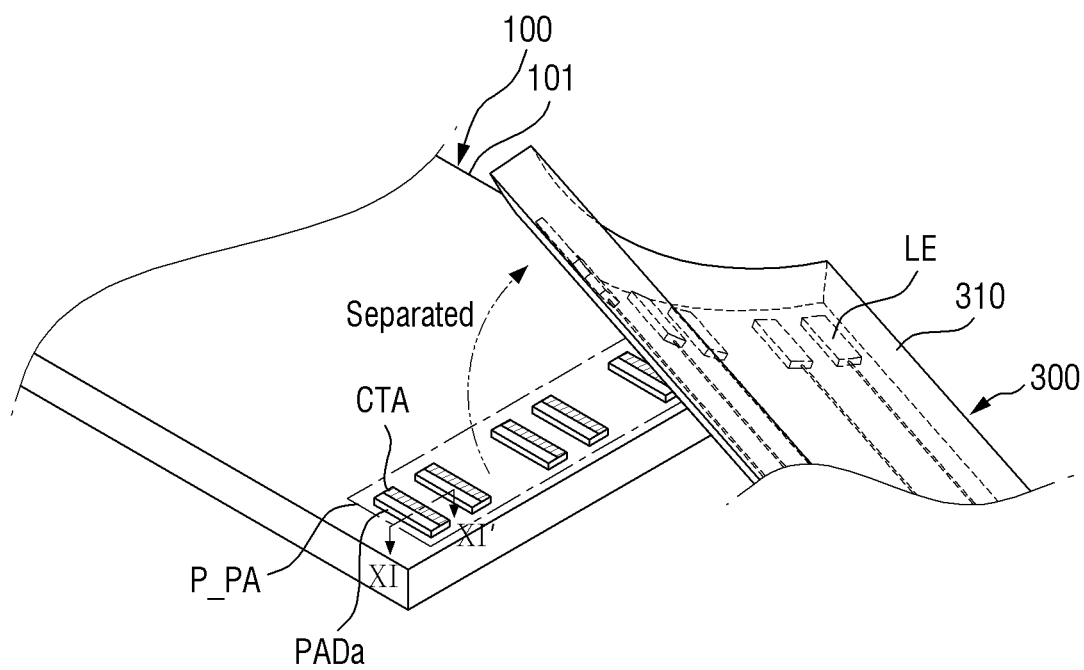
FIG. 10 is a perspective view showing a case where the printed circuit board has separated from the wiring pads of the display panel.
Figure 11:
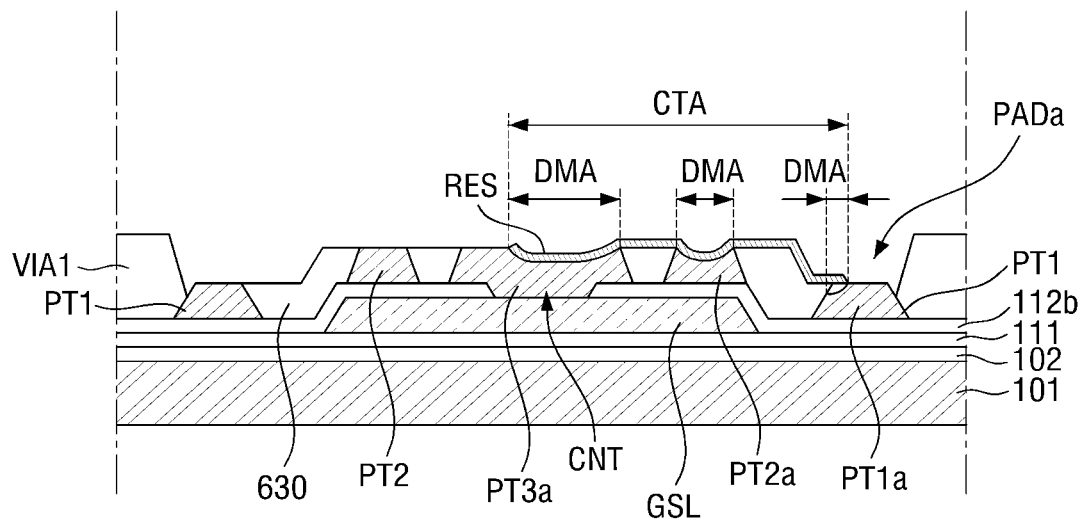
FIG. 11 is a cross-sectional view showing the panel pad area of the display panel after the separation of the printed circuit board.
Figure 12:
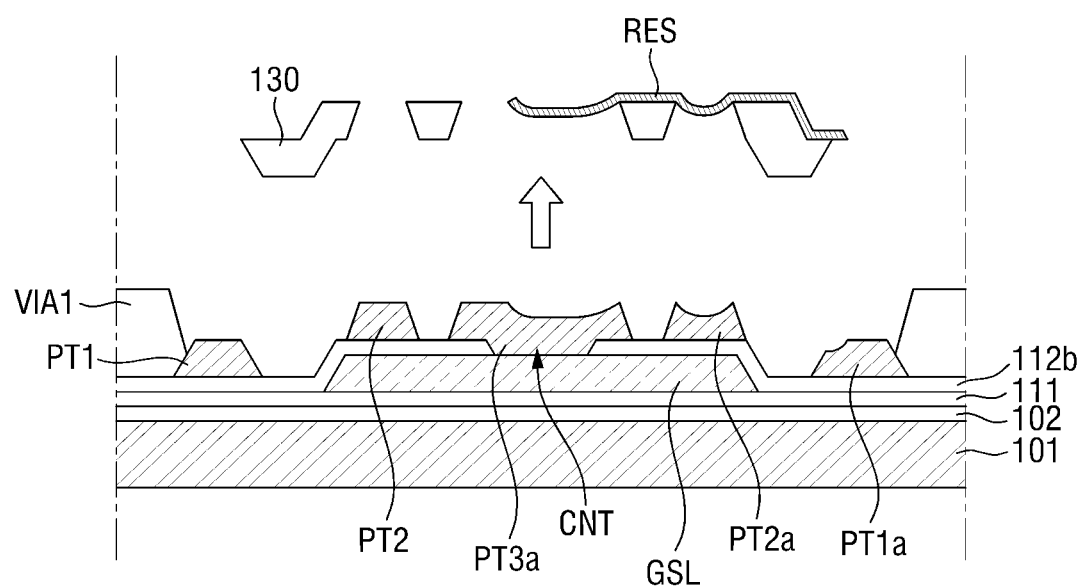
FIG. 12 is a cross-sectional view showing the separation of the pad protection layer and the residue on the pad protection layer.
Figure 13:
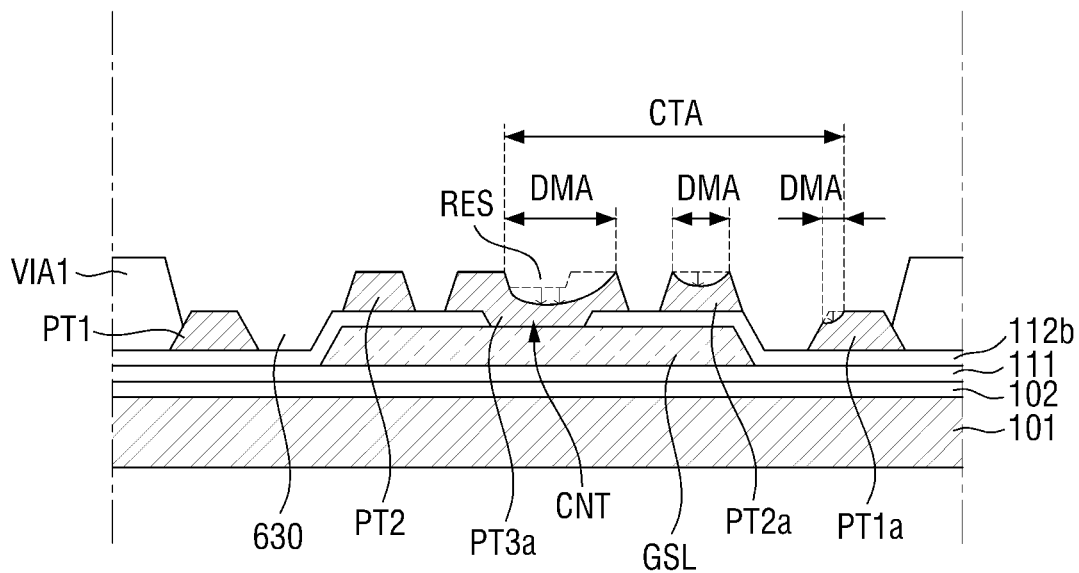
FIG. 13 is a cross-sectional view showing the panel pad area after the separation of the pad protection layer and the residue on the pad protection layer.

FIG. 9 is a perspective view showing a case where a misalignment has occurred between a plurality of leads of a printed circuit board and wiring pads of a display panel. FIG. 10 is a perspective view showing that the printed circuit board is separated from the wiring pads of the display panel. FIG. 11 is a cross-sectional view showing the panel pad area of the display panel after the separation of the printed circuit board. FIG. 12 is a cross-sectional view showing the separation of the pad protection layer and the residue on the pad protection layer. FIG. 13 is a cross-sectional view showing the panel pad area after the separation of the pad protection layer and the residue on the pad protection layer.

Referring to FIGS. 9, 10, 11, 12, and 13, the panel pad area P_PA may further include a lead contact area CTA. The lead contact area CTA refers to a contact area between the wiring pad PAD of the panel pad area P_PA and the lead wiring LE on the pad protection layer 600. In FIG. 11, it is illustrated that the lead contact area CTA overlaps a third pad pattern portion PT3a, a second pad pattern portion PT2a, a first pad pattern portion PT1a, the third protective pattern portion 630 disposed between the third pad pattern portion PT3a and the second pad pattern portion PT2a, and the third protective pattern portion 630 disposed between the second pad pattern portion PT2a and the first pad pattern portion PT1a.

In the lead contact area CTA, a wiring pad PADa may have a cross-sectional shape in which it is partially recessed in the downward direction. On the other hand, unlike the wiring pad PADa, the pad protection layer 600 may not undergo substantial shape deformation.

The recessed area due to the lead contact between the wiring pad PADa and the pad protection layer 600 is defined hereinafter as a pad damage area DMA. In FIG. 11, the pad damage area DMA may overlap a region including the third pad pattern portion PT3a, the second pad pattern portion PT2a and the first pad pattern portion PT1a that are substantially in contact with the leads of the wiring pads PADa.

In the present exemplary embodiment, by disposing the pad protection layer 600 between the plurality of separation pattern portions of the wiring pad PADa, it is possible to reduce the degree of damage to the wiring pad PADa in the pad damage area DMA when the display panel 100 is reused after separating the lead wiring LE from the panel pad area P_PA of the display panel 100.

Further, the residue RES of the lead wiring LE may remain on the wiring pad PADa and the pad protection layer 600 in the lead contact area CTA. Although FIG. 11 illustrates that the residue RES is integrally disposed on the wiring pad PADa and the pad protection layer 600, the exemplary embodiments are not limited thereto, and the residue RES may be partially separated and disposed on the wiring pad PADa and the pad protection layer 600.

Referring to FIG. 12, after the ultrasonic bonding, the pad protection layer 600 is peeled from the panel pad area P_PA. Although it is illustrated in FIG. 12 that the pad protection layer 600 is separated, in practice, as shown in FIG. 5, the pad protection layer 600 is formed integrally as a single piece on one wiring pad PADa.

As shown in FIG. 12, in the process of peeling the pad protection layer 600, the residue RES of the lead wiring LE remaining on the pad protection layer 600 and the wiring pad PADa can be removed together with the pad protection layer 600. Therefore, even if the ultrasonic bonding is performed again on the display panel 100, it is possible to prevent the efficiency of ultrasonic bonding from being lowered by the residue RES of the separated lead wiring LE.

Figure 14:
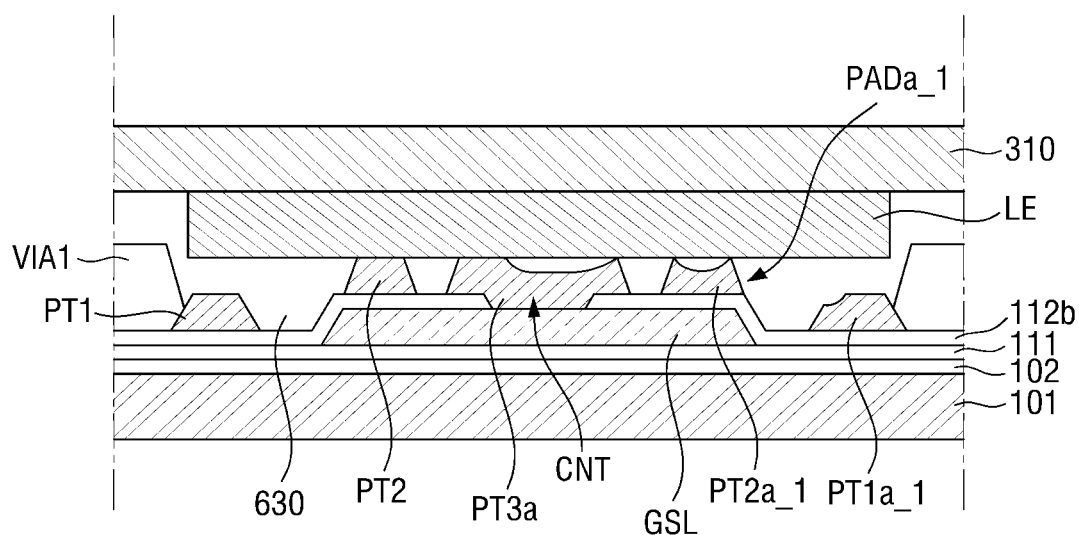
FIG. 14 is a cross-sectional view showing that the leads of the printed circuit board are bonded after the separation of the pad protection layer and the residue on the pad protection layer.

FIG. 14 is a cross-sectional view showing that the leads of the printed circuit board are bonded after the separation of the pad protection layer and the residue on the pad protection layer. FIG. 14 shows that the printed circuit board 300 is disposed in the panel pad area P_PA of FIG. 13.

Referring to FIG. 14, the present exemplary embodiment is different from the display device 1 of FIG. 6 in that the printed circuit board 300 including the lead wiring LE is connected on a wiring pad PADa_1 and it does not include the pad protection layer 600.

More specifically, the lead wiring LE may be connected onto the wiring pad PADa_1. In the wiring pad PADa_1, grooves may be formed in the downward direction in the pad damage are DMA. The lead wiring LE may be directly connected and ultrasonically bonded to the wiring pad PADa_1 including the grooves formed in the pad damage area DMA. The grooves of the wiring pad PADa_1 may be disposed in the pad damage area DMA of the wiring pad PADa_1. The pad protection layer may not be disposed between a plurality of pattern portions PT1a_1, PT2a1 and PT3a1 of the wiring pad PADa_1 in the panel pad area P_PA according to the present exemplary embodiment.

In FIG. 14, in the pad damage area DMA of each of the pad pattern portions PT1a_1, PT2a_1 and PT3a_1, each of the pad pattern portions PT1a_1, PT2a_1 and PT3a_1 may not be in direct contact with the lead wiring LE disposed thereabove, but the exemplary embodiments are not limited thereto. In the pad damage area DMA of each of the pad pattern portions PT1a_1, PT2a_1 and PT3a_1, each of the pad pattern portions PT1a_1, PT2a_1 and PT3a_1 may be partially in contact with and ultrasonically bonded to the lead wiring LE disposed thereabove.

Figure 15:
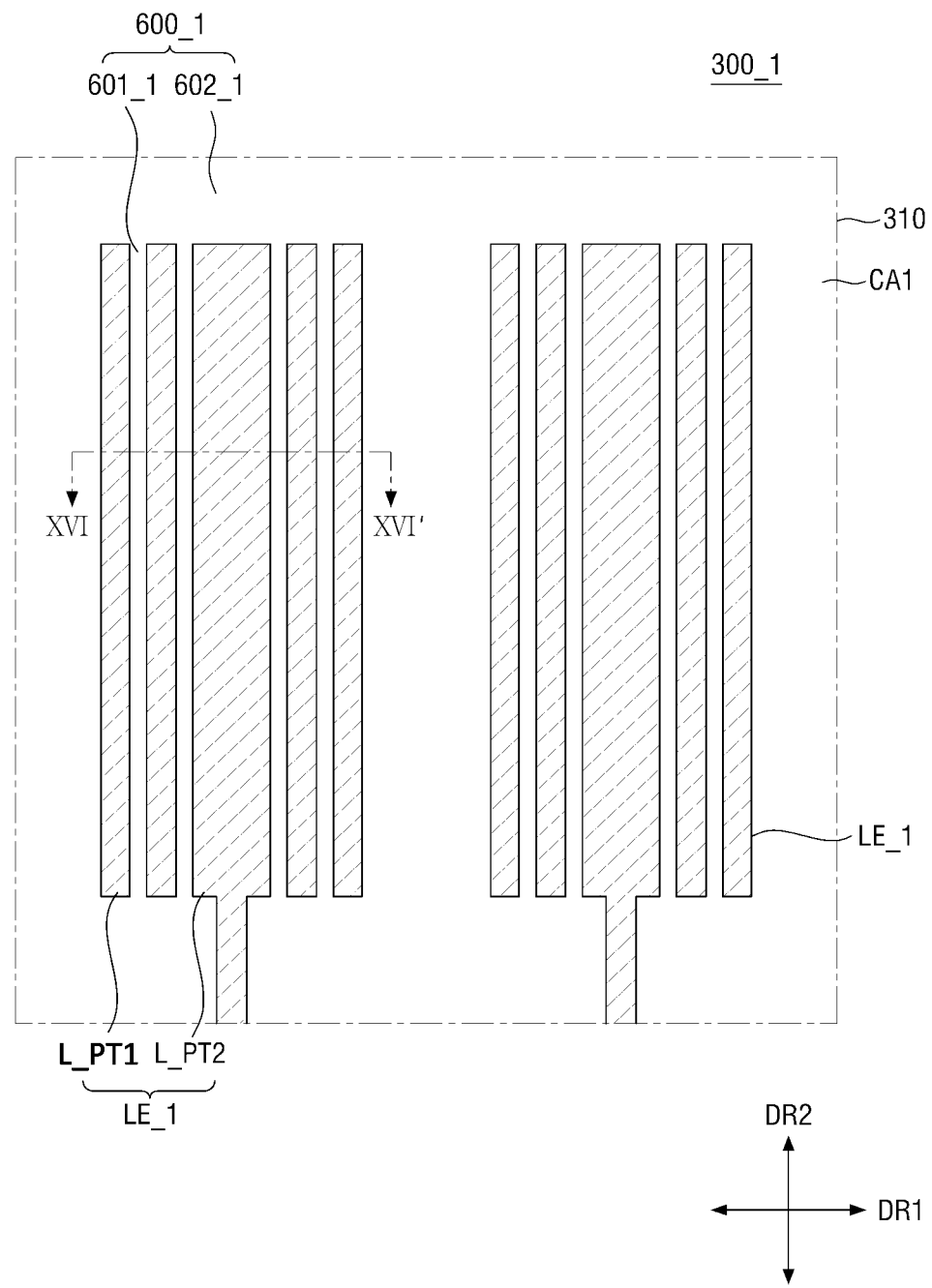
FIG. 15 is a plan layout diagram of a printed circuit board according to another exemplary embodiment.
Figure 16:
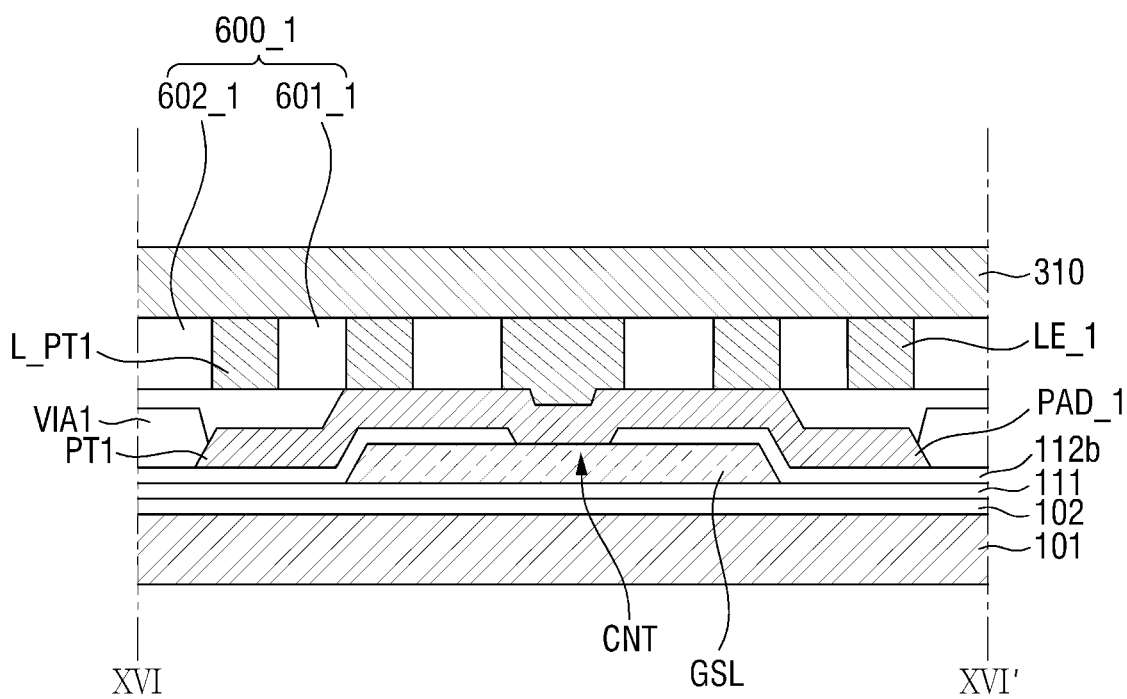
FIG. 16 is a cross-sectional view showing a wiring pad and the printed circuit board of FIG. 15, which are bonded to each other.

FIG. 15 is a plan layout diagram of a printed circuit board according to another exemplary embodiment. FIG. 16 is a cross-sectional view showing a wiring pad PAD_1 and the printed circuit board of FIG. 15, which are bonded to each other.

Referring to FIG. 15, a printed circuit board 300_1 according to the present exemplary embodiment is different from the printed circuit board 300 of FIG. 3 in that it includes a lead wiring LE_1 including a plurality of pattern portions L_PT1 and L_PT2.

More specifically, the printed circuit board 300_1 according to the present exemplary embodiment may include the lead wiring LE_1 including a plurality of pattern portions L_PT1 and L_PT2 separated from each other. That is, the lead wiring LE_1 may include a second lead pattern portion L_PT2 which is electrically connected to the driving integrated circuit 390 and extends in the second direction DR2, and a first lead pattern portion L_PT1 which is electrically separated from the driving integrated circuit 390 and extends in the second direction DR2.

Although FIG. 15 illustrates one second lead pattern portion L_PT2, the exemplary embodiments are not limited thereto, and two or more second lead pattern portions L_PT2 may be provided. Further, although FIG. 15 illustrates a case where two first lead pattern portions L_PT1 are disposed on each of one side and the other side with the second lead pattern portion L_PT2 interposed therebetween, the exemplary embodiments are not limited thereto, and one or three or more first lead pattern portions L_PT1 may be disposed on each of one side and the other side of the second lead pattern portion L_PT2.

The printed circuit board 300_1 may further include a lead protection layer 600_1 disposed between the plurality of pattern portions L_PT1 and L_PT2 of the lead wiring LE_1. The lead protection layer 600_1 may include a material substantially the same as the constituent material of the pad protection layer 600 of the above-described embodiment.

The lead protection layer 600_1 may include a first lead protective pattern portion 601_1 disposed between the plurality of pattern portions L_PT1 and L_PT2 separated from each other and a second lead protective pattern portion 602_1 surrounding the lead wiring LE_1 in plan view. The second lead protective pattern portion 602_1 may be disposed to extend between the adjacent lead wirings LE_1. That is, the lead protection layer 600_1 may include the plurality of lead protective pattern portions 601_1 and 602_1 formed integrally with each other.

Referring to FIG. 16, at least a part of the plurality of pattern portions L_PT1 and L_PT2 of the lead wiring LE_1 and the lead protection layer 600_1 disposed between the plurality of pattern portions L_PT1 and L_PT2 may be in direct contact with the wiring pad PAD_1 disposed therebelow. That is, the second lead pattern portion L_PT2 of the lead wiring LE_1 may be directly connected to the wiring pad PAD_1 disposed therebelow. Although it is illustrated in FIG. 16 that the second lead pattern portion L_PT2 is not in contact with the wiring pad PAD_1 in a region where only the wiring pad PAD_1 and the gate signal line GSL of the wiring pad PAD_1 disposed therebelow are arranged and the second insulating layer 112b is not arranged, the exemplary embodiments are not limited thereto. The second lead pattern portion L_PT2 may be directly connected to the wiring pad PAD_1 in a region where only the wiring pad PAD_1 and the gate signal line GSL of the wiring pad PAD_1 disposed therebelow are arranged and the second insulating layer 112b is not arranged.

Further, the first lead pattern portions L_PT1 separated from each other with the second lead pattern portion L_PT2 interposed therebetween may be directly connected to the wiring pad PAD_1 disposed therebelow. Although it is illustrated in FIG. 16 that the first lead pattern portions L_PT1 separated from the second lead pattern portion L_PT2 with the first lead pattern portions L_PT1, which are adjacent to the second lead pattern portion L_PT2 in plan view, interposed therebetween are not in contact with the wiring pad PAD_1 disposed therebelow, the exemplary embodiments are not limited thereto. The first lead pattern portions L_PT1 separated from the second lead pattern portion L_PT2 with the first lead pattern portions L_PT1, which are adjacent to the second lead pattern portion L_PT2 in plan view, interposed therebetween may be in direct contact with the wiring pad PAD_1 disposed therebelow.

In addition, the first lead protective pattern portion 601_1 disposed between the second lead pattern portion L_PT2 and the first lead pattern portion L_PT1 may be in direct contact with the wiring pad PAD_1 disposed therebelow, and the second lead protective pattern portion 602_1 may be separated from the wiring pad PAD_1 disposed therebelow in the thickness direction. Although it is illustrated in FIG. 16 that the first lead protective pattern portion 601_1 disposed between the adjacent first lead pattern portions L_PT1 is not in contact with the wiring pad PAD_1 disposed therebelow, the exemplary embodiments are not limited thereto. The first lead protective pattern portion 601_1 disposed between the adjacent first lead pattern portions L_PT1 may be in contact with the wiring pad PAD_1 disposed therebelow.

In some embodiments, the lead protection layer 600_1 may not include the second lead protective pattern portion 602_1, but may include only the first lead protective pattern portion 601_1 disposed between the plurality of lead pattern portions L_PT1 and L_PT2 of the lead wiring LE_1. In this case, the lead protection layer 600_1 may have portions separated from each other with the plurality of lead pattern portions L_PT1 and L_PT2 interposed therebetween, without being integrally formed.

In some embodiments, the lead protection layer 600_1 may not be integrally formed, and the planar shape of the lead wiring LE_1 may be substantially the same as the planar shape of the wiring pad PAD described above with reference to FIG. 5. That is, the lead wiring LE_1 may further include a third lead pattern portion surrounding the lead pattern portions L_PT1 and L_PT2 in plan view, and the lead protection layer 600_1 may be surrounded by the third lead pattern portion.

Also in the present exemplary embodiment, by disposing the pad protection layer 600_1 between the plurality of separation pattern portions of the lead wiring LE_1, it is possible to reduce damage to the wiring pad PAD_1 when the display panel 100 is reused after separating the lead wiring LE_1 from the panel pad area P_PA of the display panel 100.

Figure 17:
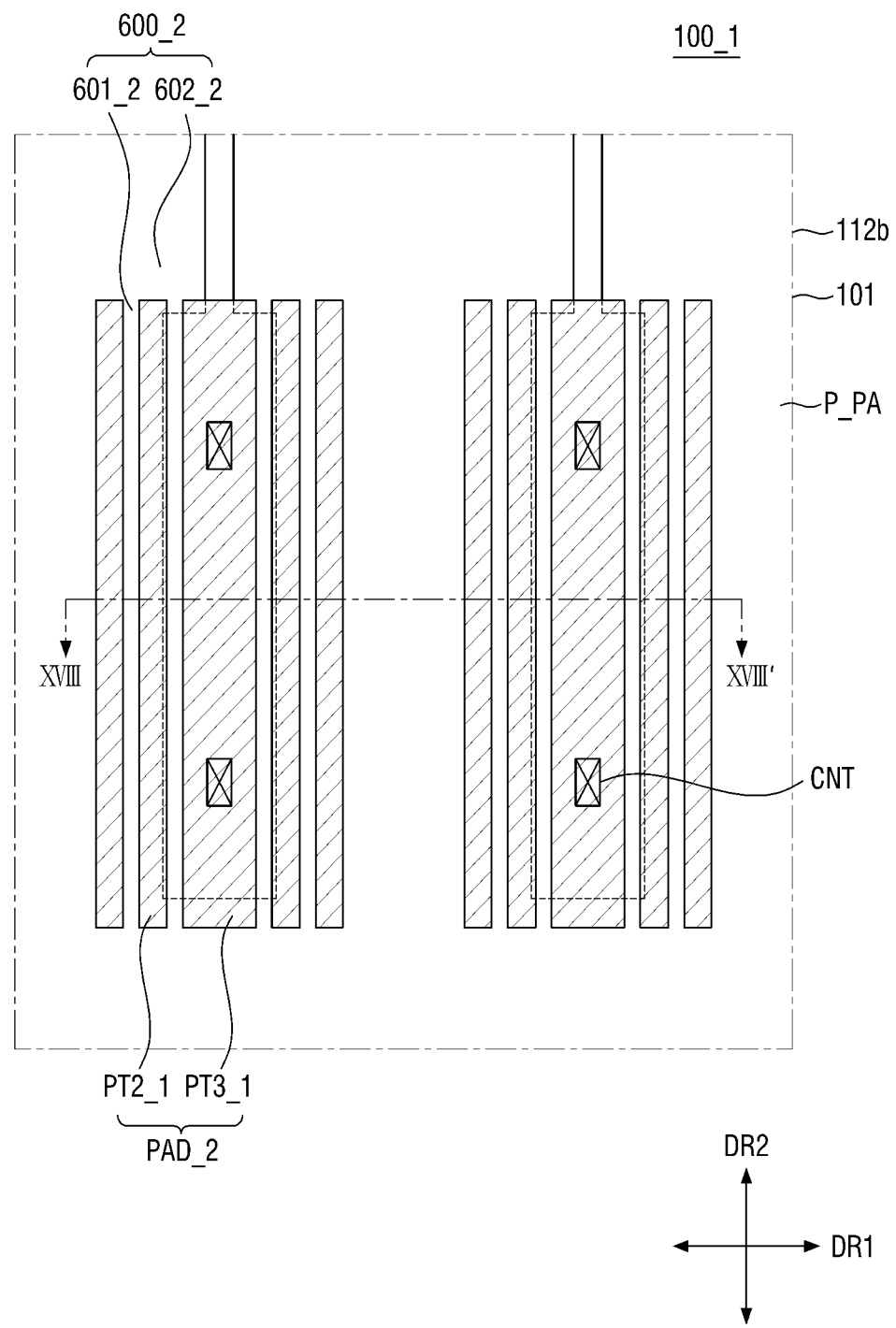
FIG. 17 is a plan layout diagram of a panel pad area according to another exemplary embodiment.
Figure 18:
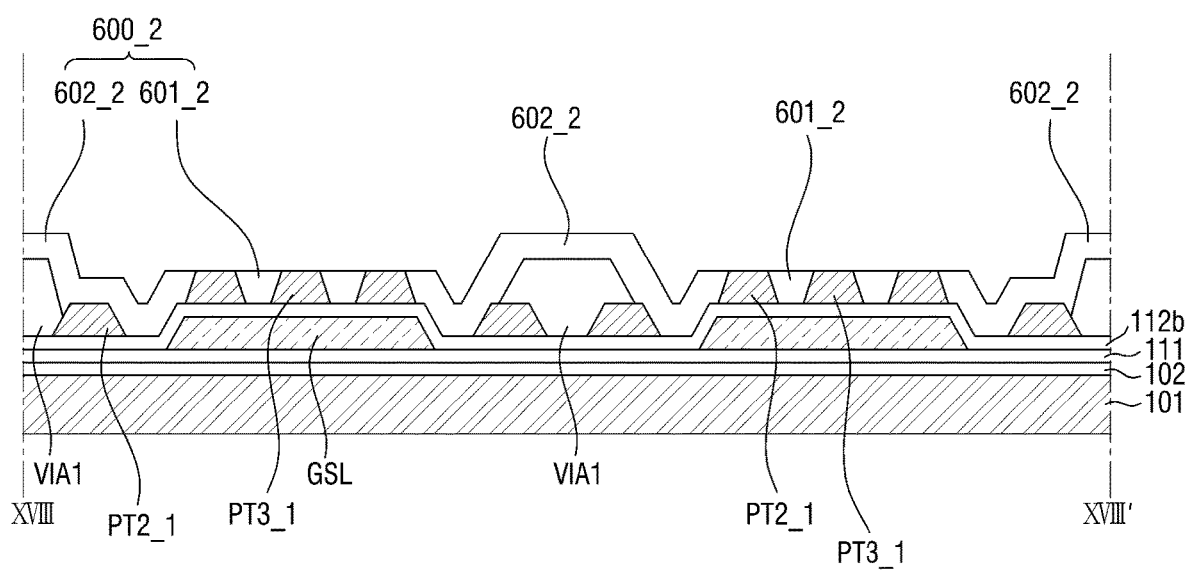
FIG. 18 is a cross-sectional view taken along a sectional line XVIII-XVIII' of FIG. 17.

FIG. 17 is a plan layout diagram of a panel pad area according to another exemplary embodiment. FIG. 18 is a cross-sectional view taken along a sectional line XVIII-XVIII' of FIG. 17.

Referring to FIGS. 17 and 18, a wiring pad PAD_2 according to the present exemplary embodiment is different from the wiring pad PAD according to the above-described embodiment in that its planar shape is substantially the same as the planar shape of the lead wiring LE_1 described above with reference to FIG. 15.

More specifically, the wiring pad PAD_2 may not include the first pad pattern portion PT1 unlike the wiring pad PAD of FIG. 5. That is, the wiring pad PAD_2 may include a second pad pattern portion PT2_1 which is the same as the second pad pattern portion PT2 described above with reference to FIG. 5 and a third pad pattern portion PT3_1 which is the same as the third pad pattern portion PT3 described above with reference to FIG. 5.

A pad protection layer 600_2 disposed between the plurality of pad pattern portions PT2_1 and PT3_1 of the wiring pad PAD_2 may have substantially the same planar shape as the planar shape of the lead protection layer 600_1 disposed between the plurality of lead pattern portions L_PT1 and L_PT2 of the lead wiring LE_1 described above with reference to FIG. 15. That is, the pad protection layer 600_2 may include a first pad protective pattern portion 601_2 disposed between the third pad pattern portion PT3_1 and the adjacent second pad pattern portion PT2_1 and between the adjacent second pad pattern portions PT2_1 and a second pad protective pattern portion 602_2 disposed between the adjacent wiring pads PAD_2 to surround the entire first pad pattern portion PT1_1 and the second pad pattern portion PT2_1 in plan view.

Figure 19:
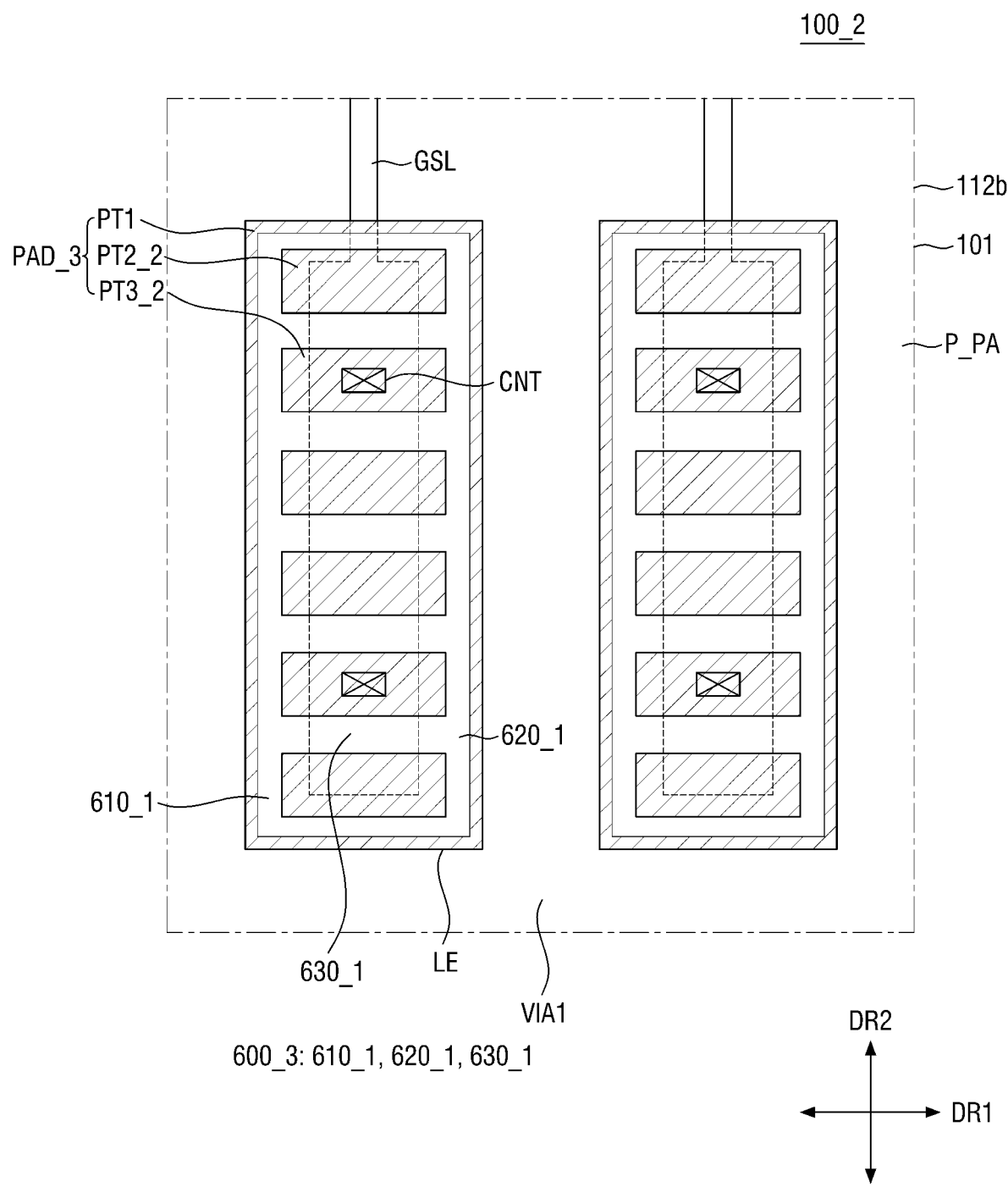
FIG. 19 is a plan layout diagram of a panel pad area according to still another exemplary embodiment.

FIG. 19 is a plan layout diagram of a panel pad area according to still another exemplary embodiment.

Referring to FIG. 19, a wiring pad PAD_3 according to the present exemplary embodiment is different from the wiring pad PAD according to the above-described embodiment in the planar shapes of a second pad pattern portion PT2_2 and a third pad pattern portion PT3_2.

More specifically, each of the second pad pattern portion PT2_2 and the third pad pattern portion PT3_2 of the wiring pad PAD_3 according to the present exemplary embodiment may have a linear shape extending in the first direction DR1. Although FIG. 19 illustrates that the third pad pattern portions PT3_2 electrically connected to the gate signal line GSL disposed therebelow are disposed between the adjacent second pad pattern portions PT2_2, the exemplary embodiments are not limited thereto.

A pad protection layer 600_3 according to the present exemplary embodiment may include a first protective pattern portion 610_1 and a second protective pattern portion 620_1 disposed between the second pad pattern portion PT2_2 and the third pad pattern portion PT3_2 adjacent to the long side edges of the first pad pattern portion PT1 of the wiring pad PAD_3, and may include a third protective pattern portion 630_1 disposed between the second pad pattern portions PT2_2 adjacent to the short side edges of the first pad pattern portion PT1. The third protective pattern portion 630_1 may be further disposed between the adjacent second pad pattern portion PT2_2 and the third pad pattern portion PT3_2.

Also in the present exemplary embodiment, by disposing the pad protection layer 600_3 between the plurality of separation pattern portions of the wiring pad PAD_3, it is possible to reduce the area of the substantially damaged wiring pad PAD_3 in the pad damage area when a display panel 100_2 is reused after separating the lead wiring LE from the panel pad area P_PA of the display panel 100_2.

Further, when the display panel 100_2 is reused, in the process of peeling the pad protection layer 600_3, the residue of the lead wiring remaining on the pad protection layer 600_3 and the wiring pad PAD_3 is removed together with the pad protection layer 600_3. Accordingly, even if the ultrasonic bonding is performed again on the display panel 100_2, it is possible to prevent the efficiency of ultrasonic bonding from being lowered by the residue of the separated lead wiring.

Figure 20:
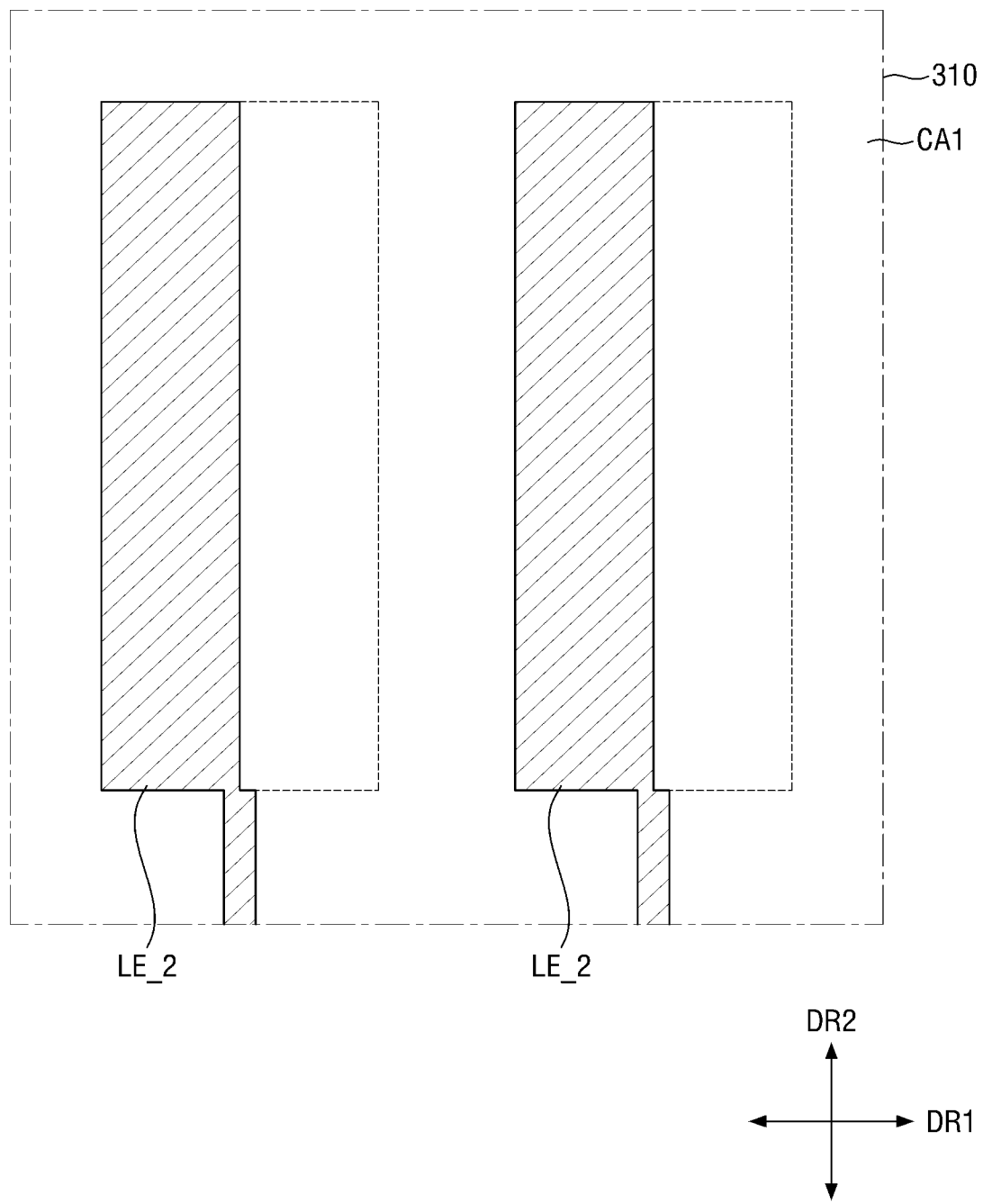
FIG. 20 is a plan layout diagram of a printed circuit board according to still another exemplary embodiment.

FIG. 20 is a plan layout diagram of a printed circuit board according to still another exemplary embodiment.

Referring to FIG. 20, a printed circuit board 300_2 according to the present exemplary embodiment is different from the above-described embodiment in that the area of a lead wiring LE_2 is smaller than the area of the lead wiring LE according to the above-described embodiment.

More specifically, in the printed circuit board 300_2 according to the present exemplary embodiment, as shown in FIG. 20, the lead wiring LE_2 has an area which is substantially half of the area of the lead wiring LE according to the above-described embodiment.

Also in the present exemplary embodiment, by reducing the area of the lead wiring LE_2, it is possible to reduce damage to the wiring pad when the display panel is reused after separating the lead wiring LE_2 from the panel pad area of the display panel.

Figure 21:
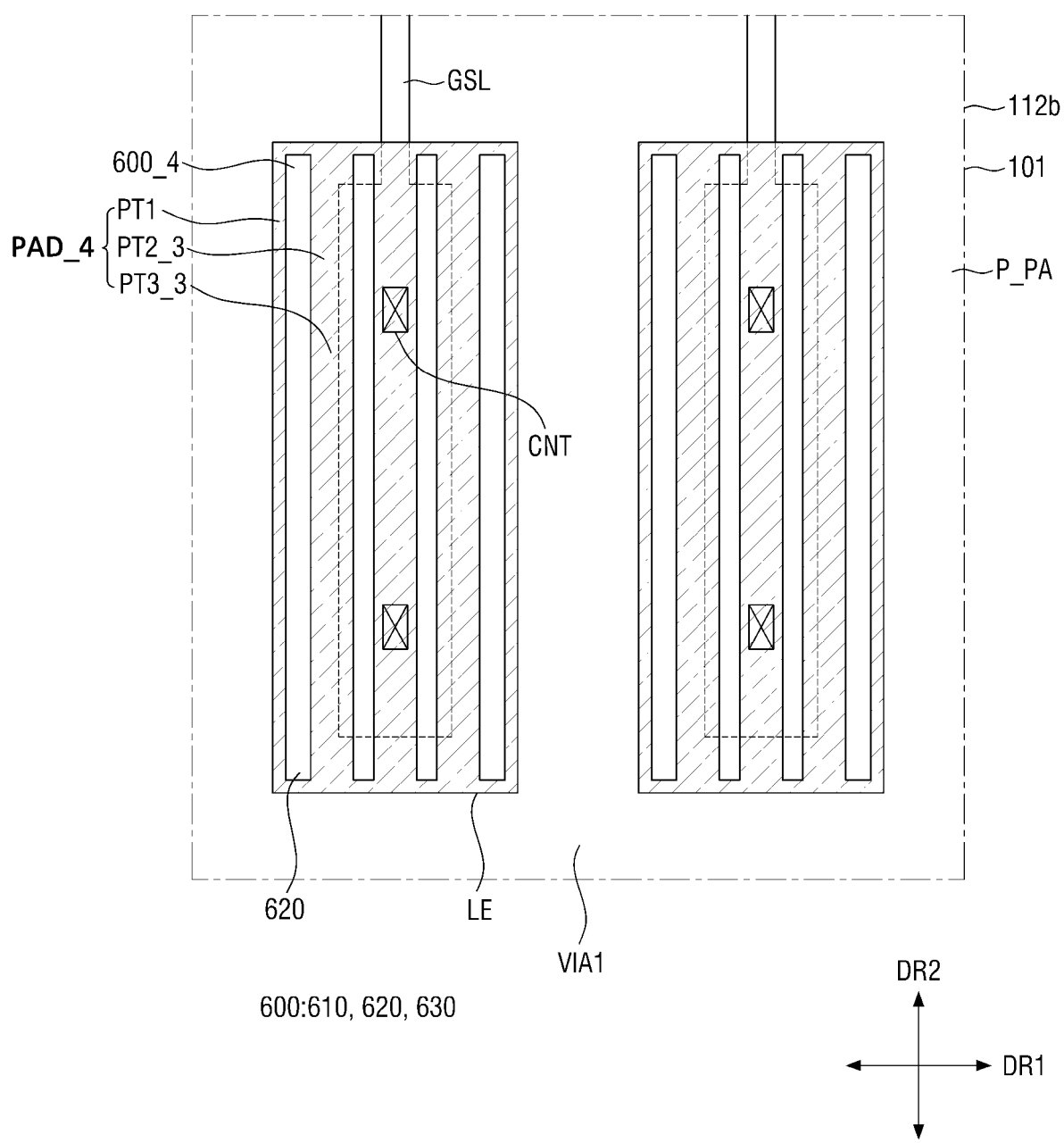
FIG. 21 is a plan layout diagram of a panel pad area according to still another exemplary embodiment.

FIG. 21 is a plan layout diagram of a panel pad area according to still another exemplary embodiment.

Referring to FIG. 21, a wiring pad PAD_4 according to the present exemplary embodiment is different from the wiring pad PAD according to the above-described embodiment in that it is integrally formed.

More specifically, the second pad pattern portion PT2_3 and the third pad pattern portion PT3_3 of the wiring pad PAD_4 according to the present exemplary embodiment may be physically connected to the first pad pattern portion PT1.

Further, a pad protection layer 600_4 according to the present exemplary embodiment may be disposed between the adjacent first pad pattern portion PT1 and the second pad pattern portion PT2_3 and between the second pad pattern portion PT2_3 and the third pad pattern portion PT3_3. The pad protection layer 600_4 may have portions separated from each other with the second pad pattern portion PT2_3 and the third pad pattern portion PT3_3 interposed therebetween.

Also in the present exemplary embodiment, by disposing the pad protection layer 600_4 between the plurality of separation pattern portions of the wiring pad PAD_4, it is possible to reduce the area of the substantially damaged wiring pad PAD_4 in the pad damage area when a display panel 100_3 is reused after separating the lead wiring LE from the panel pad area P_PA of the display panel 100_3.

Further, when the display panel 100_3 is reused, in the process of peeling the pad protection layer 600_4, the residue of the lead wiring remaining on the pad protection layer 600_4 and the wiring pad PAD_4 is removed together with the pad protection layer 600_4. Accordingly, even if the ultrasonic bonding is performed again on the display panel 100_3, it is possible to prevent the efficiency of ultrasonic bonding from being lowered by the residue of the separated lead wiring.

Figure 22:
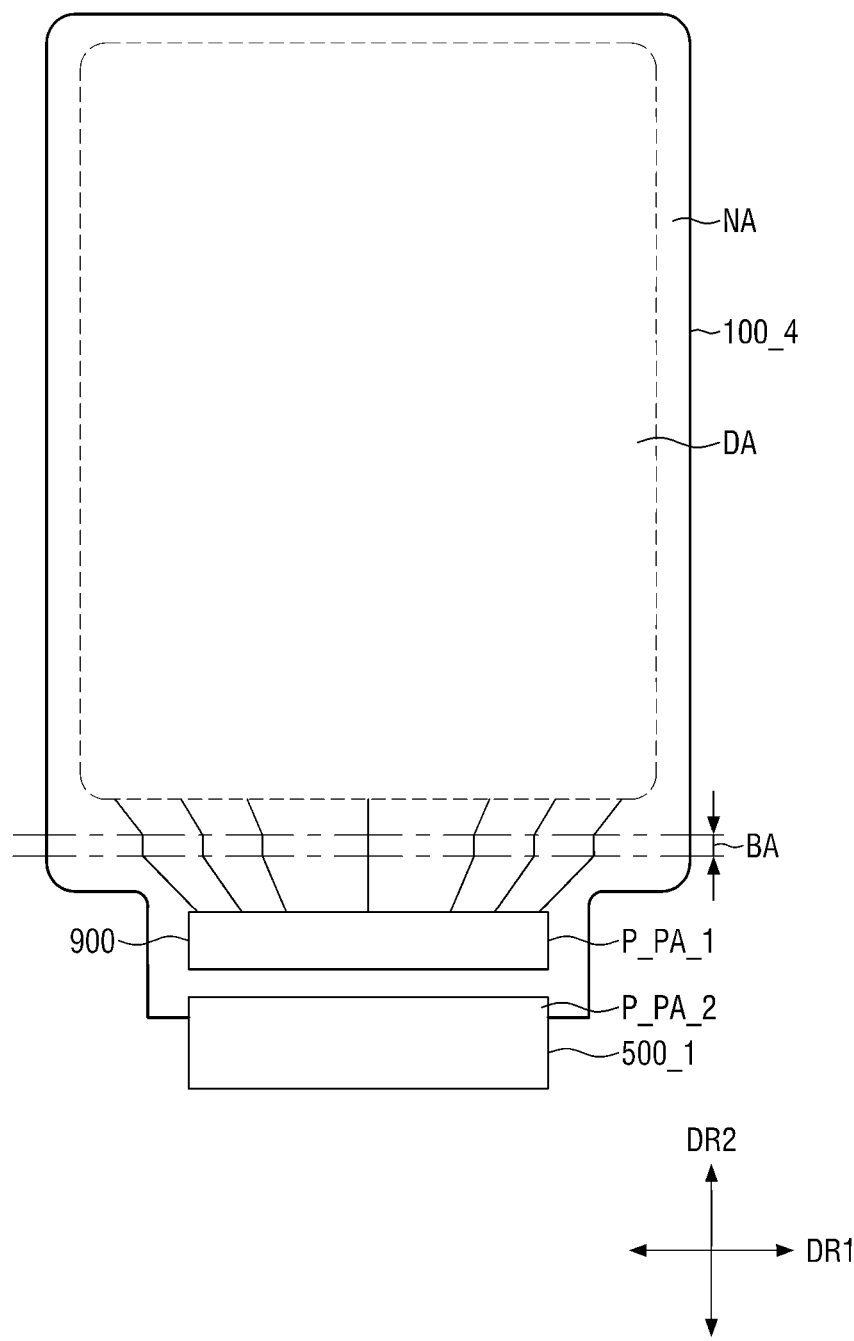
FIG. 22 is a plan layout diagram of a display device according to another exemplary embodiment.
Figure 23:
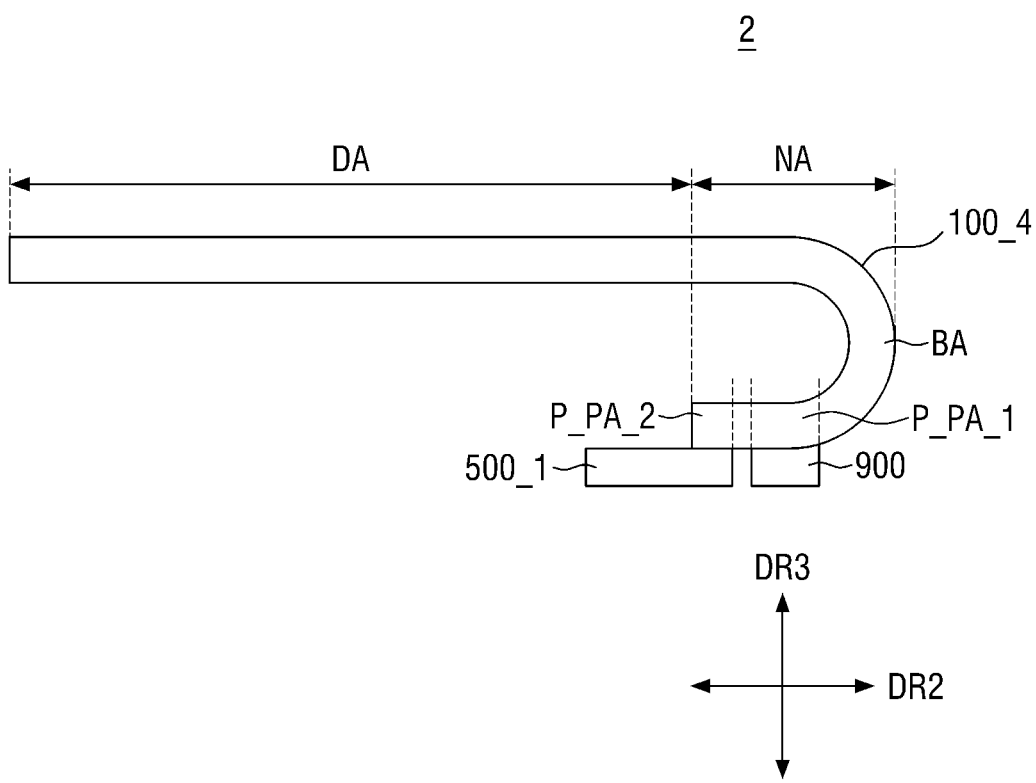
FIG. 23 is a cross-sectional view of a display device according to another exemplary embodiment.

FIG. 22 is a plan layout diagram of a display device according to another exemplary embodiment. FIG. 23 is a cross-sectional view of a display device according to another exemplary embodiment.

Referring to FIGS. 22 and 23, a display panel 100_4 of a display device 2 according to the present exemplary embodiment may further include a bending area BA.

A display substrate of the display panel 100_4 may be made of an insulating material such as polymer resin. Examples of the polymeric material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The display substrate 101 may include a metallic material. The display substrate 101 may be a flexible substrate which can be bent, folded or rolled. An example of the material of the flexible substrate may be polyimide (PI), but is not limited thereto.

The bending area BA may be disposed between an array of a plurality of pixels and a panel pad area P_PA_1. The bending area BA may be located in the non-display area NA. The display panel 100_4 may be folded in one direction with respect to a bending line which is a reference line disposed in the bending area BA. The bending line may be a straight line parallel to a lower side (or an upper side) of the display panel 100_4. As shown in FIG. 23, the bending area BA of the display panel 100_4 may be bent downward in the third direction DR3.

However, the exemplary embodiments are not limited thereto, and the display area DA and the panel pad area P_PA_1 may be connected to each other without the bending area BA. That is, in the display panel 100_4, the entire area of the display area DA and the non-display area NA may be flat without the bending area BA.

In the panel pad area P_PA_1, a plurality of wiring pads PAD described above with reference to FIG. 5 are arranged. A driving integrated circuit 900 may be attached onto the plurality of wiring pads PAD.

In this exemplary embodiment, a chip on plastic (COP) or a chip on glass (COG) may be applied to the driving integrated circuit 900. The driving integrated circuit 900 may include a plurality of bumps connected to the plurality of wiring pads PAD. The bumps may be formed of at least one of gold (Au), nickel (Ni) and tin (Sn).

In this exemplary embodiment, the bumps of the driving integrated circuit 900 may be coupled in direct contact with the respective wiring pads PAD without an intervening layer or structure. The direct coupling between the wiring pads PAD and the bumps of the driving integrated circuit 900 may be performed by ultrasonic bonding.

FIG. 24 is a flowchart of a method of manufacturing a display panel according to the exemplary embodiments.

According to the exemplary embodiments, the method of manufacturing a display panel according to the exemplary embodiments includes: providing a display substrate including a display area and a pad area disposed around the display area (S01); disposing a signal wiring over the display area and the pad area on the display substrate (S03); disposing at least one wiring pad including: a pad pattern portion on the pad area of the display substrate, the pad pattern portion electrically connected to the signal wiring; and a separation pattern portion separated from the pad portion pattern portion by a separation space (S05); disposing a pad protection layer disposed in the separation space between the pad pattern portion and the separation pattern portion (S07); and providing a printed circuit board including a lead wiring; and attaching the printed circuit board to the pad area of the display substrate by connecting the lead wiring to the at least one wiring pad (S09). According to the exemplary embodiments, the attaching of the printed circuit board includes ultrasonically bonding the lead wiring and the at least one wiring pad.

The method of manufacturing the display panel according to the exemplary embodiments further includes: separating the printed circuit board from the pad area of the display substrate (S11); and removing residue of the lead wiring left on the pad protection layer and the at least one wiring pad from separating the printed circuit board from the pad area of the display substrate (S13). According to the exemplary embodiments, the removing of the residue of the lead wiring includes: peeling the pad protection layer from the pad area to remove the residue disposed on the at least at least one wiring pad and the pad protection layer.

The method of manufacturing the display panel according to the exemplary embodiments further includes: realigning and attaching the printed circuit board back to the pad area of the display substrate by connecting the lead wiring to the at least one wiring pad (S15).

The detailed description of the display substrate, the signal wiring, the at least one wiring pad including the pad pattern portion and the separation pattern portion, the pad protection layer, and the printed circuit board including the lead wiring may be referred to the exemplary embodiments illustrated in FIGS. 1, 2, 3, 4, 5, 6, 7, 8, 9, 10, 11, 12, 13, 14, 15, 16, 17, 18, 19, 20, 21, 22, and 23.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display substrate comprising a display area and a pad area disposed around the display area;
   a signal wiring disposed over the display area and the pad area on the display substrate;
   at least one wiring pad comprising:
   a pad pattern portion disposed on the pad area of the display substrate, the pad pattern portion electrically connected to the signal wiring; and a separation pattern portion separated from the pad pattern portion by a separation space; and
a printed circuit board attached to the pad area of the display substrate, the printed circuit board comprising a lead wiring connected to the at least one wiring pad,
wherein:
the separation pattern portion is not directly connected to the pad pattern portion;
the pad pattern portion overlaps the signal wiring in a plan view;
the separation pattern portion is insulated from the signal wiring; and
the separation pattern portion overlaps the signal wiring in the plan view.

2. The display device of claim 1, further comprising a pad protection layer disposed in the separation space between the pad pattern portion and the separation pattern portion.

3. The display device of claim 2, wherein the pad protection layer comprises an organic insulating material.

4. The display device of claim 2, wherein the separation pattern portion is separated from the pad pattern portion along a first direction.

5. The display device of claim 4, wherein the pad pattern portion has a linear shape extending along a second direction intersecting the first direction, and
wherein a shape of the separation pattern portion in a plan view is the same as a shape of the pad pattern portion in the plan view.

6. The display device of claim 5, wherein the second direction is a direction from a distal end of the pad area toward the display area.

7. The display device of claim 4, wherein the at least one wiring pad comprises a first wiring pad and a second wiring pad separated from each other, and
wherein the pad protection layer is further disposed between the first wiring pad and the second wiring pad in a plan view.

8. The display device of claim 1, wherein the pad pattern portion and the separation pattern portion are directly connected to the lead wiring.

9. The display device of claim 8, wherein the pad pattern portion and the separation pattern portion are ultrasonically bonded to the lead wiring.

10. A display device comprising:
a display substrate comprising a display area and a pad area disposed around the display area;
a signal wiring disposed over the display area and the pad area on the display substrate;
at least one wiring pad comprising:
a pad pattern portion disposed on the pad area of the display substrate, the pad pattern portion electrically connected to the signal wiring; and
a separation pattern portion separated from the pad pattern portion by a separation space;
a printed circuit board attached to the pad area of the display substrate, the printed circuit board comprising a lead wiring connected to the at least one wiring pad; and
a pad protection layer disposed in the separation space between the pad pattern portion and the separation pattern portion,
wherein the separation pattern portion is separated from the pad pattern portion along a first direction,
wherein the first direction intersects a direction from an end portion of the pad area toward the display area, and
wherein a width of the pad pattern portion in the first direction is larger than a width of the separation pattern portion in the first direction.

11. A display device comprising:
a display substrate comprising a display area and a pad area disposed around the display area;
a signal wiring disposed over the display area and the pad area on the display substrate;
at least one wiring pad comprising:
a pad pattern portion disposed on the pad area of the display substrate, the pad pattern portion electrically connected to the signal wiring; and
a separation pattern portion separated from the pad pattern portion by a separation space;
a printed circuit board attached to the pad area of the display substrate, the printed circuit board comprising a lead wiring connected to the at least one wiring pad; and
a pad protection layer disposed in the separation space between the pad pattern portion and the separation pattern portion,
wherein the separation pattern portion is separated from the pad pattern portion along a first direction, and
wherein the at least one wiring pad further comprises an edge pattern portion having a rectangular frame shape to surround the pad pattern portion and the separation pattern portion in a plan view.

12. The display device of claim 11, wherein the pad pattern portion, the separation pattern portion and the edge pattern portion are separated from each other, and
wherein the pad protection layer is formed as a single piece in an area defined by the edge pattern portion in the plan view.

13. The display device of claim 11, wherein the edge pattern portion and the pad pattern portion are physically connected to each other, and the edge pattern portion and the separation pattern portion are physically connected to each other.

14. The display device of claim 13, wherein the pad protection layer comprises a plurality of pad protective pattern portions which are separated from each other and disposed between the edge pattern portion and the separation pattern portion and between the separation pattern portion and the pad pattern portion.

15. A display device comprising:
a display substrate comprising a display area and a pad area disposed around the display area;
a signal wiring disposed over the display area and the pad area on the display substrate;
at least one wiring pad comprising:
a pad pattern portion disposed on the pad area of the display substrate, the pad pattern portion electrically connected to the signal wiring; and
a separation pattern portion separated from the pad pattern portion by a separation space;
a printed circuit board attached to the pad area of the display substrate, the printed circuit board comprising a lead wiring connected to the at least one wiring pad; and
a pad protection layer disposed in the separation space between the pad pattern portion and the separation pattern portion,
wherein the separation pattern portion is separated from the pad pattern portion along a first direction,
wherein the at least one wiring pad comprises a first wiring pad and a second wiring pad separated from each other, and wherein the pad protection layer is further disposed between the first wiring pad and the second wiring pad in a plan view, wherein the display device further comprises a via layer disposed between the first wiring pad and the second wiring pad on the display substrate, and wherein the pad protection layer overlaps the via layer.

\* \* \* \* \*